United States Patent
Lee et al.

(10) Patent No.: US 11,777,004 B2
(45) Date of Patent: Oct. 3, 2023

(54) FIN FIELD EFFECT TRANSISTOR (FINFET) DEVICE STRUCTURE AND METHOD FOR FORMING THE SAME

(71) Applicant: Taiwan Semiconductor Manufacturing Company, Ltd., Hsinchu (TW)

(72) Inventors: Kai-Hsuan Lee, Hsinchu (TW); I-Wen Wu, Hsinchu (TW); Chen-Ming Lee, Taoyuan (TW); Jian-Hao Chen, Hsinchu (TW); Fu-Kai Yang, Hsinchu (TW); Feng-Cheng Yang, Zhudong Township, Hsinchu County (TW); Mei-Yun Wang, Chu-Pei (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 211 days.

(21) Appl. No.: 17/313,368

(22) Filed: May 6, 2021

(65) Prior Publication Data
US 2022/0359683 A1    Nov. 10, 2022

(51) Int. Cl.
*H01L 29/417* (2006.01)
*H01L 29/40* (2006.01)
*H01L 29/66* (2006.01)
*H01L 29/78* (2006.01)
*H01L 29/49* (2006.01)

(52) U.S. Cl.
CPC ...... *H01L 29/41791* (2013.01); *H01L 29/401* (2013.01); *H01L 29/4991* (2013.01); *H01L 29/66795* (2013.01); *H01L 29/7851* (2013.01)

(58) Field of Classification Search
CPC ............ H01L 29/41791; H01L 29/401; H01L 29/4991; H01L 29/66795; H01L 29/7851
See application file for complete search history.

(56) References Cited

U.S. PATENT DOCUMENTS

| | | | |
|---|---|---|---|
| 9,305,835 B2 * | 4/2016 | Alptekin | H01L 21/28008 |
| 10,236,358 B1 * | 3/2019 | Patil | H01L 29/66545 |
| 10,388,770 B1 * | 8/2019 | Xie | H01L 29/41775 |
| 11,201,228 B2 * | 12/2021 | Lee | H01L 21/764 |
| 11,289,417 B2 * | 3/2022 | Chou | H01L 21/76895 |
| 2015/0243544 A1 * | 8/2015 | Alptekin | H01L 21/7682 438/586 |
| 2017/0125539 A1 * | 5/2017 | Cheng | H01L 29/66545 |
| 2018/0040559 A1 * | 2/2018 | Chang | H01L 23/53257 |
| 2018/0166553 A1 * | 6/2018 | Lee | H01L 29/41766 |
| 2018/0366553 A1 * | 12/2018 | Zang | H01L 23/535 |
| 2019/0378762 A1 * | 12/2019 | Tang | H01L 29/6653 |
| 2020/0126843 A1 * | 4/2020 | Tsai | H01L 21/76897 |

(Continued)

*Primary Examiner* — Earl N Taylor
(74) *Attorney, Agent, or Firm* — Birch, Stewart, Kolasch & Birch, LLP

(57) ABSTRACT

A FinFET device structure is provided. The FinFET device structure includes a fin structure formed over a substrate, and a first inter-layer dielectric (ILD) layer formed over the fin structure. The FinFET device structure includes a gate structure formed in the first ILD layer, and a first S/D contact structure formed in the first ILD layer and adjacent to the gate structure. The FinFET device structure also includes a first air gap formed on a sidewall of the first S/D contact structure, and the first air gap is in direct contact with the first ILD layer.

20 Claims, 36 Drawing Sheets

(56) References Cited

U.S. PATENT DOCUMENTS

| | | | |
|---|---|---|---|
| 2020/0127110 A1* | 4/2020 | Lee | H01L 29/0649 |
| 2020/0328286 A1* | 10/2020 | Chen | H01L 29/66545 |
| 2021/0043499 A1* | 2/2021 | Tsai | H01L 29/66545 |
| 2021/0066500 A1* | 3/2021 | Liu | H01L 21/823807 |
| 2021/0083067 A1* | 3/2021 | Wang | H01L 29/45 |
| 2021/0098365 A1* | 4/2021 | Chou | H01L 21/76819 |
| 2021/0384079 A1* | 12/2021 | Tang | H01L 21/0332 |
| 2022/0216147 A1* | 7/2022 | Chou | H01L 29/6653 |
| 2022/0359683 A1* | 11/2022 | Lee | H01L 29/41791 |

\* cited by examiner

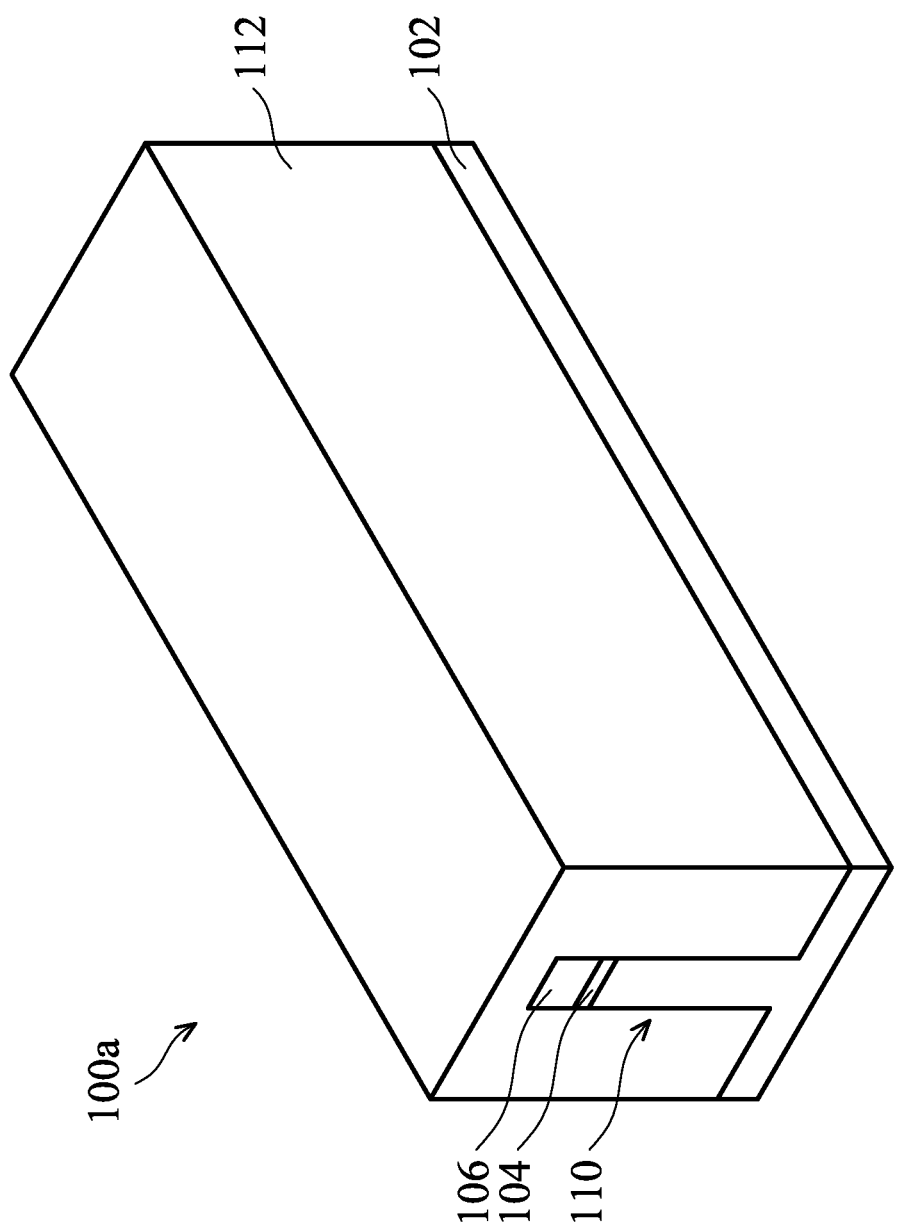

US 11,777,004 B2

1

FIN FIELD EFFECT TRANSISTOR (FINFET) DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1J show perspective representations of various stages of forming a FinFET device structure, in accordance with some embodiments of the disclosure.

DETAILED DESCRIPTION

Figure 1A:
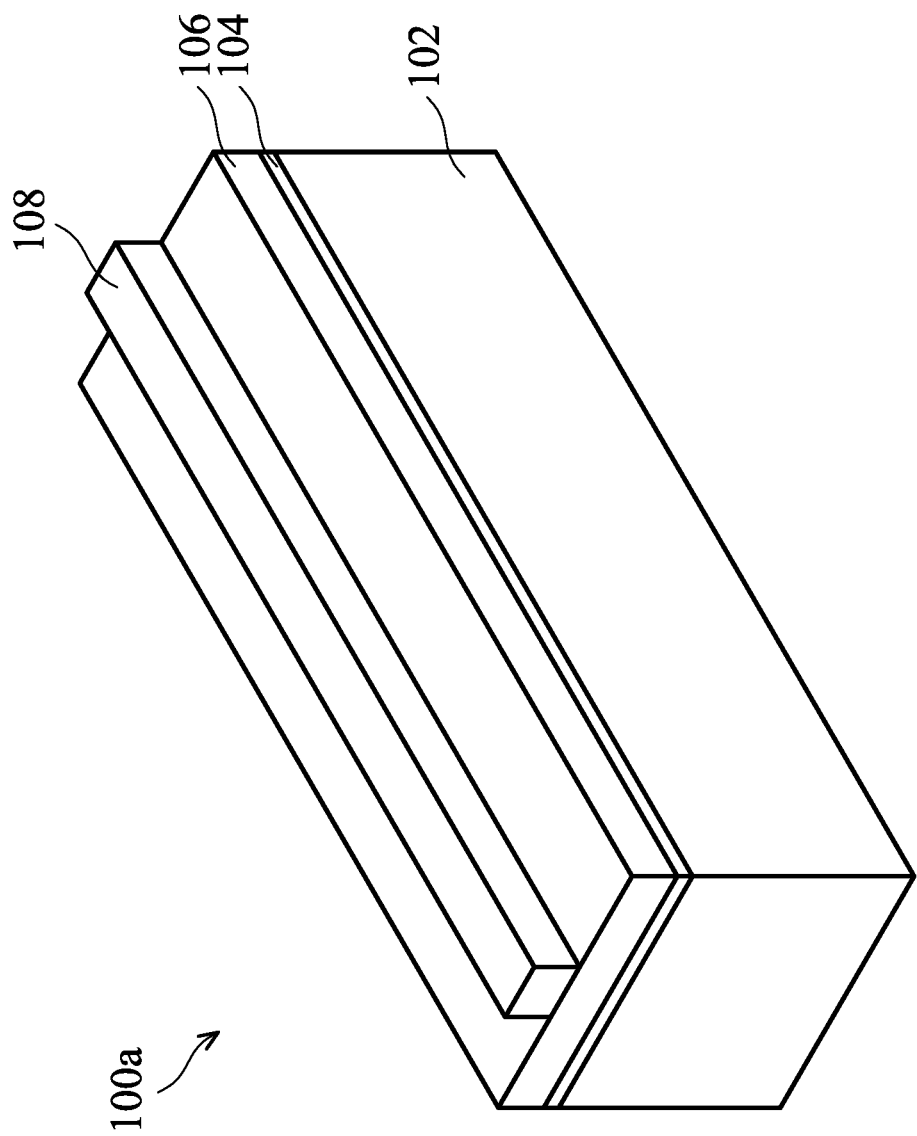

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1J show perspective representations of various stages of forming a FinFET device structure 100a, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
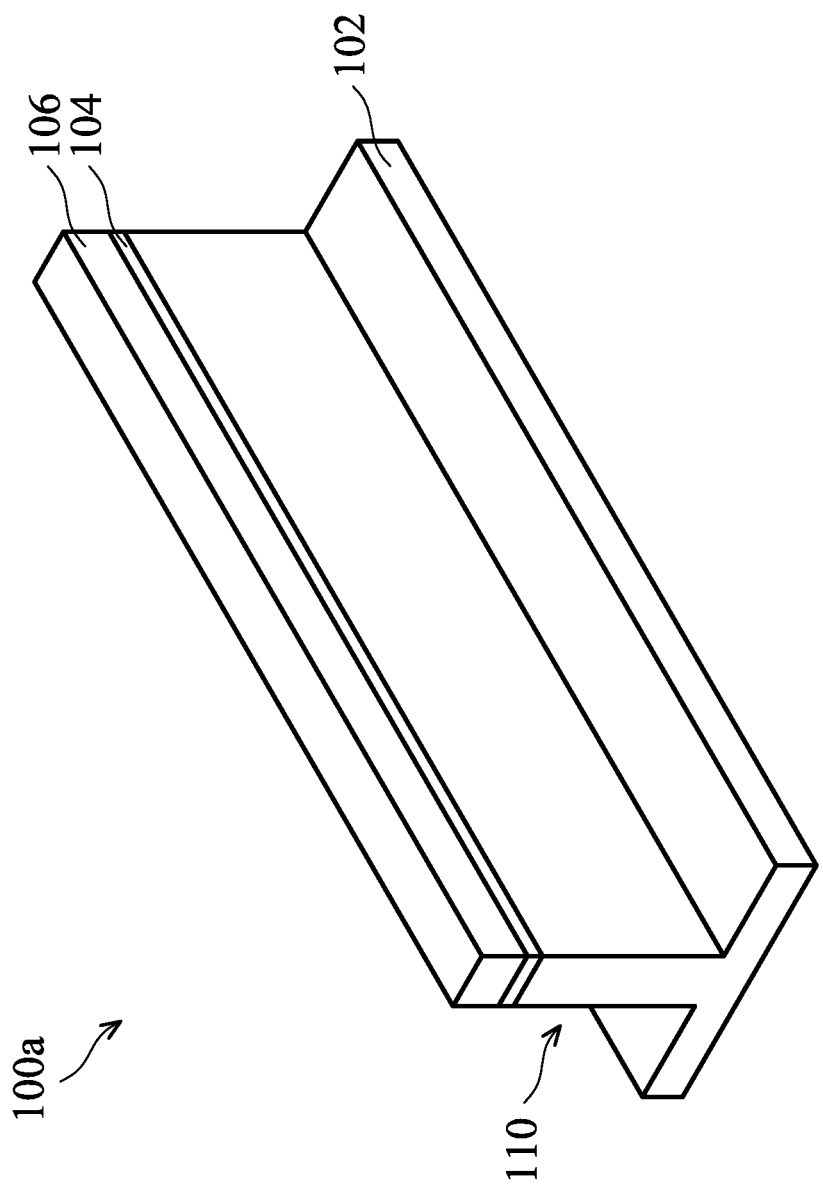

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned pad layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), low-k dielectric material or another applicable material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process.

Figure 1D:
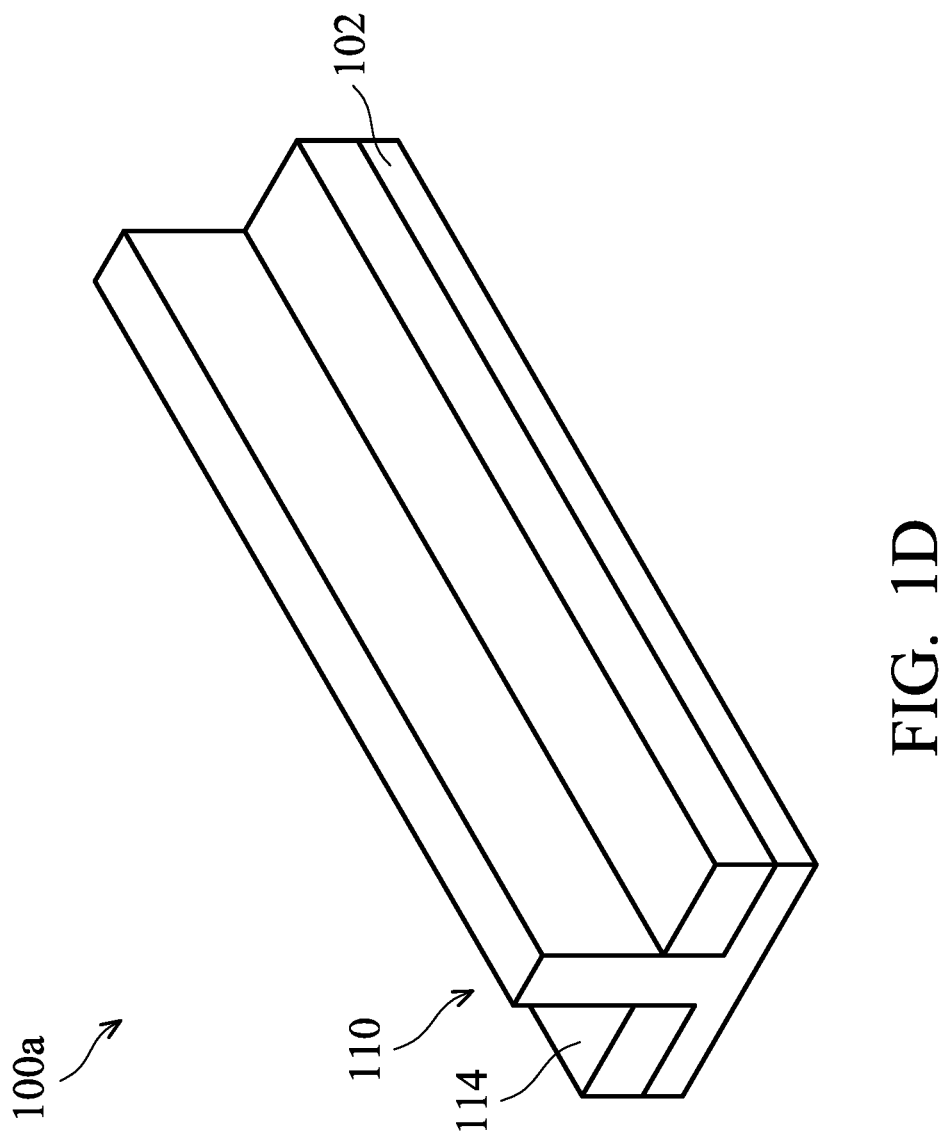

Afterwards, as shown in FIG. 1D, the patterned dielectric layer 104 and the patterned mask layer 106, and a portion of the insulating layer 112 is removed by an etching process, in accordance with some embodiments. As a result, an isolation structure 114 is obtained. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference and crosstalk.

Figure 1E:
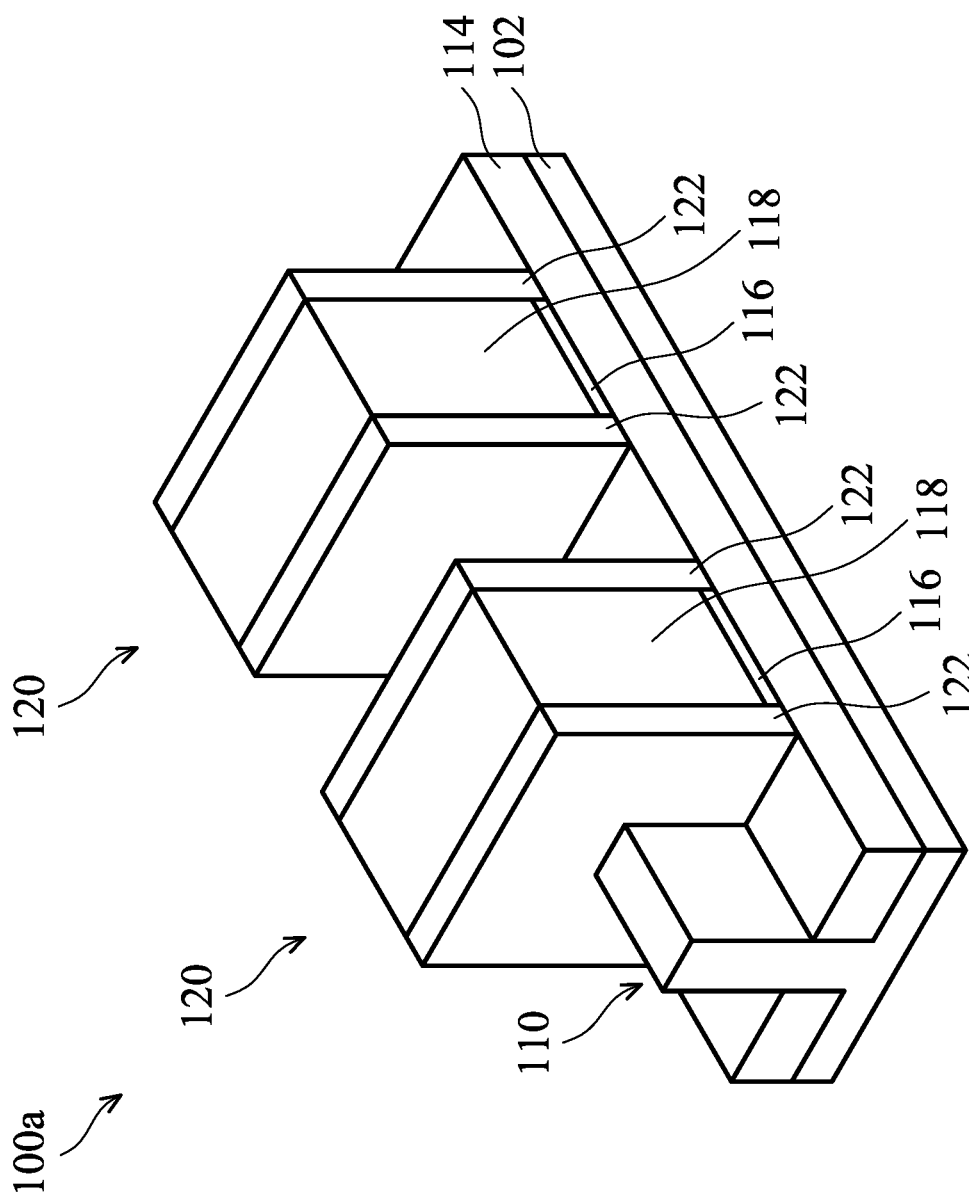

Afterwards, as shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. In some embodiments, the dummy gate dielectric layer 116 includes silicon oxide, and the dummy gate electrode layer 118 includes polysilicon. After the dummy gate structure 120 is formed, the gate spacer layers 122 are formed on opposite sidewall surfaces of the dummy gate structure 120. The gate spacer layers 122 may be a single layer or multiple layers.

In order to improve the speed of the FinFET device structure 100a, the gate spacer layers 122 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments. ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

Figure 1F:
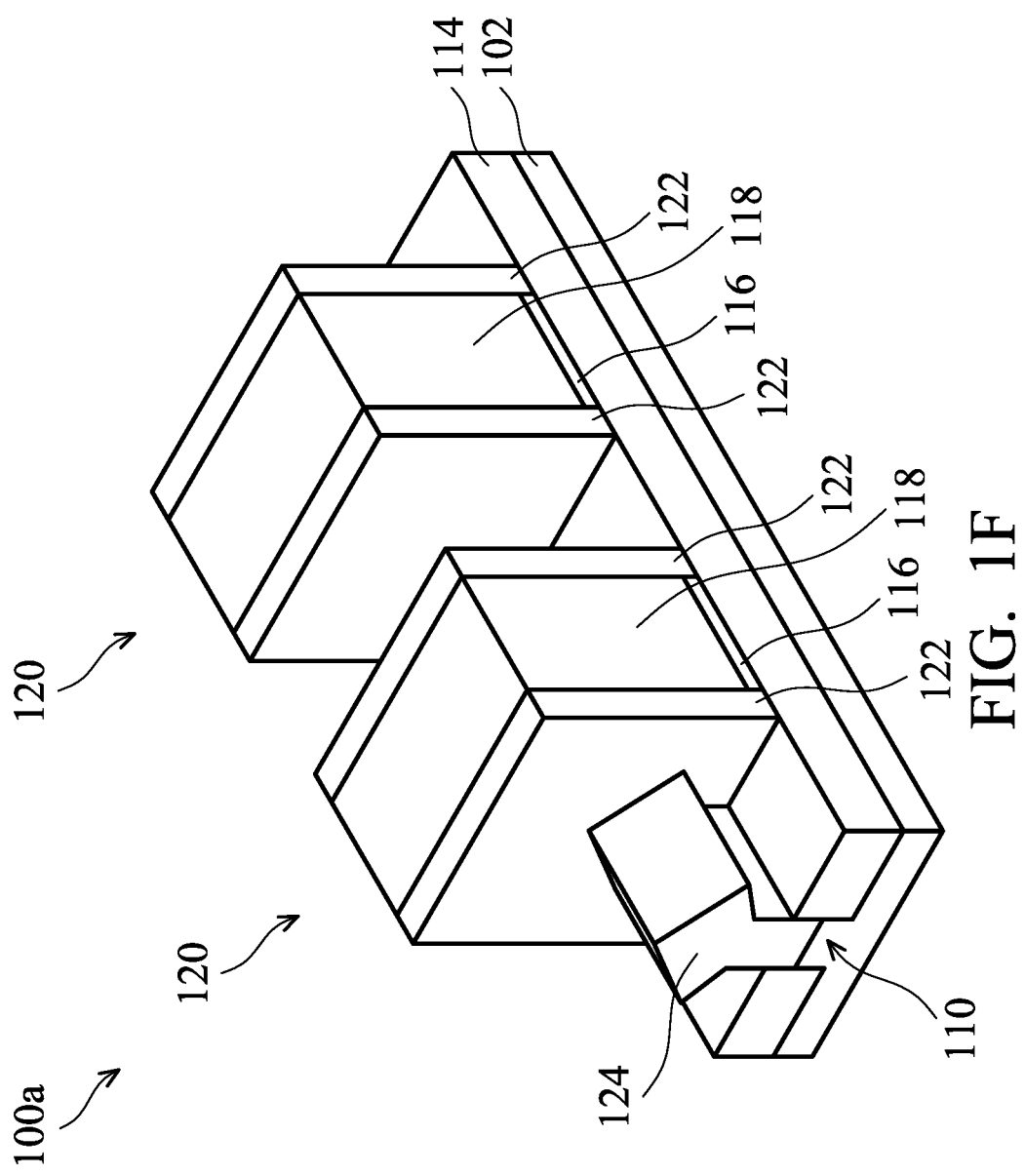

Afterwards, as shown in FIG. 1F, the source/drain (S/D) structures 124 are formed over the fin structure 110, in accordance with some embodiments. In some embodiments, portions of the fin structure 110 adjacent to the dummy gate structure 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

Figure 1G:
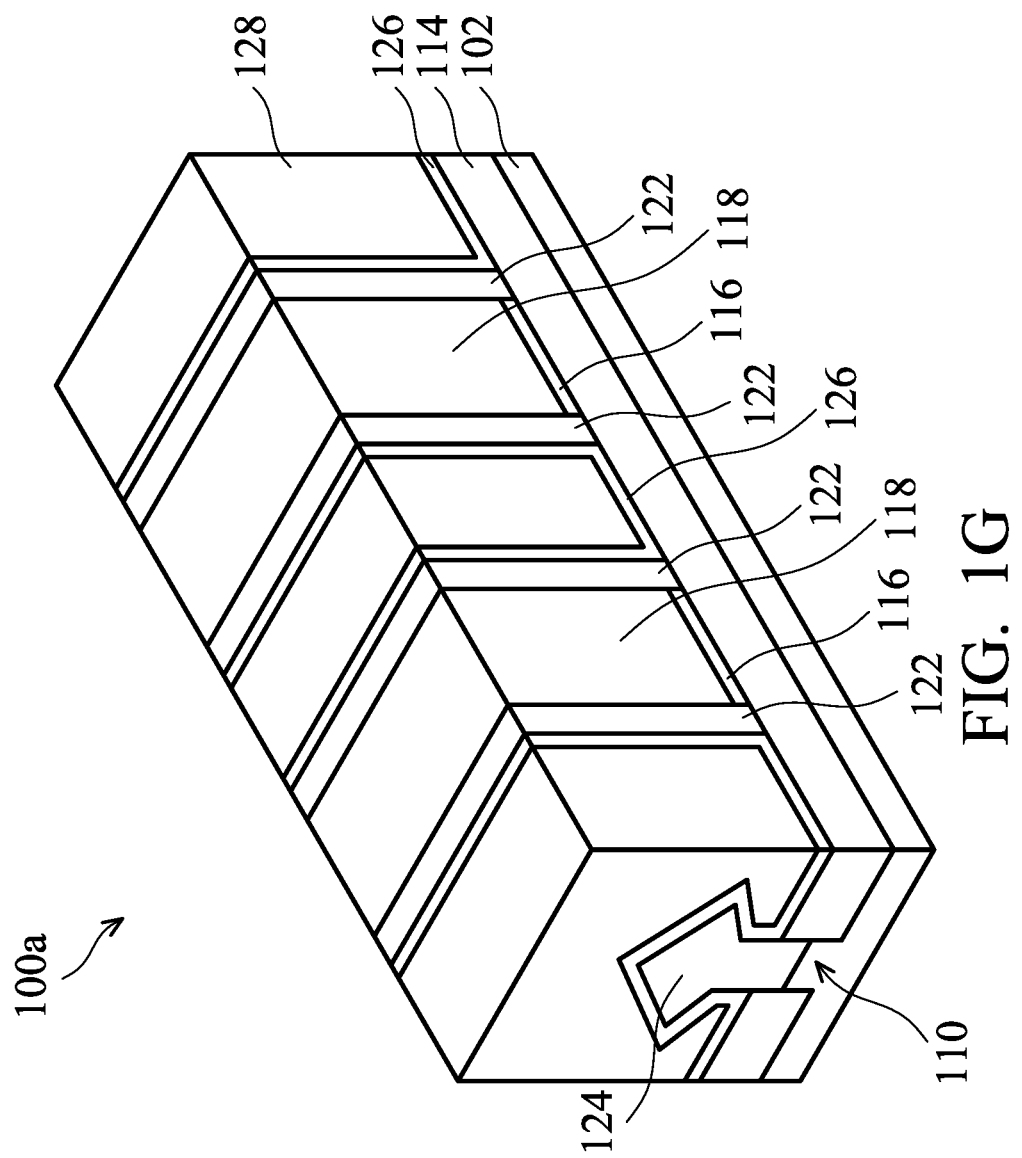

Afterwards, as shown in FIG. 1G, a contact etch stop layer (CESL) 126 is formed over the substrate 102, and a first inter-layer dielectric (ILD) layer 128 is formed over the CESL 126, in accordance with some embodiments. In some other embodiments, the CESL 126 is made of silicon nitride, silicon oxynitride, and/or other applicable materials. The CESL 126 may be formed by plasma enhanced CVD, low-pressure CVD, ALD, or other applicable processes.

The first ILD layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD layer 128 may be formed by chemical vapor deposition (CVD), physical vapor deposition, (PVD), atomic layer deposition (ALD), spin-on coating, or another applicable process.

Afterwards, a polishing process is performed on the first ILD layer 128 until the top surface of the dummy gate structure 120 is exposed. In some embodiments, the first ILD layer 128 is planarized by a chemical mechanical polishing (CMP) process.

Figure 1H:
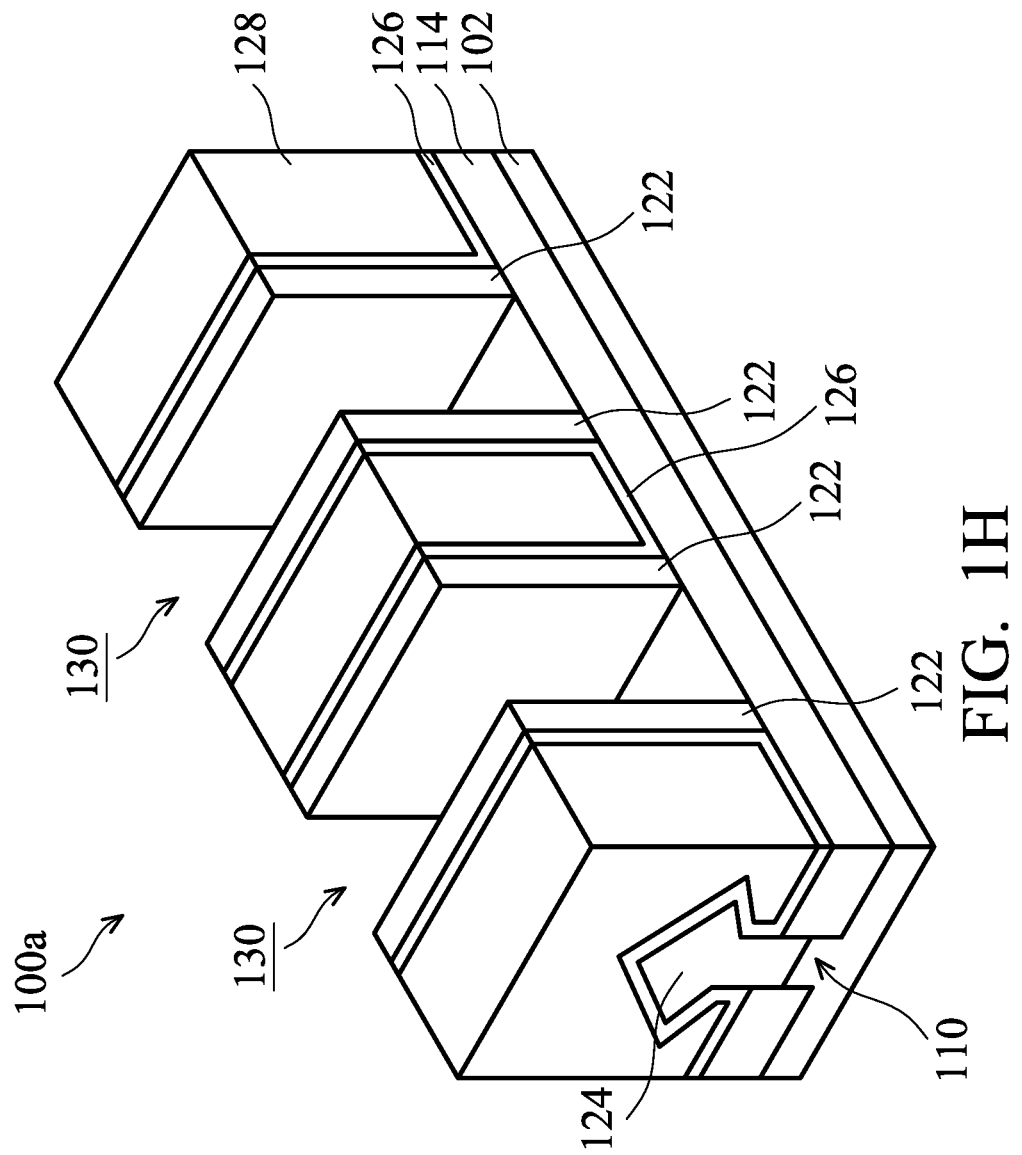

Afterwards, as shown in FIG. 1H, the dummy gate structure 120 is removed to form a trench 130 in the first ILD layer 128, in accordance with some embodiments. The dummy gate dielectric layer 116 and the dummy gate electrode layer 118 are removed by an etching process, such as a dry etching process or a wet etching process.

Figure 1I:
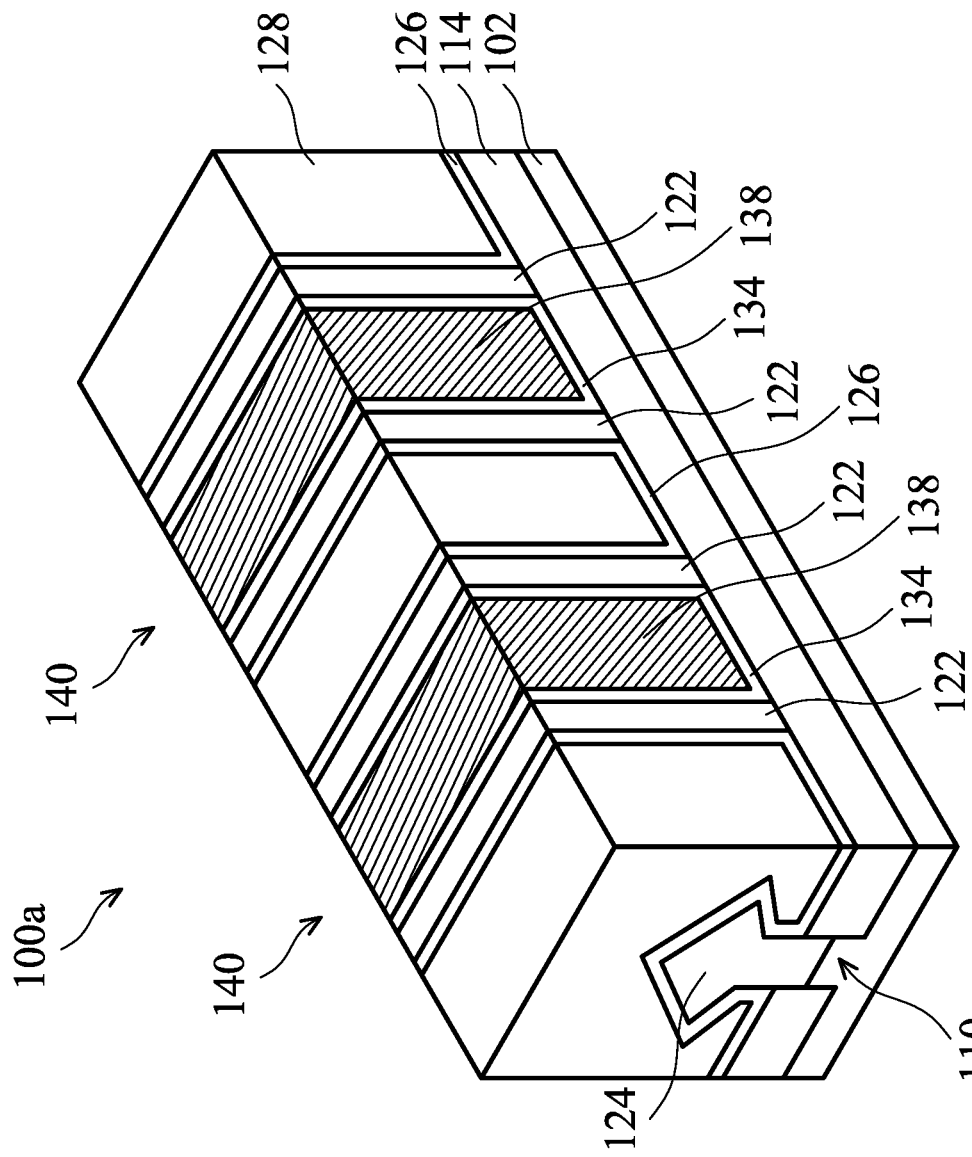

Next, as shown in FIG. 1I, a gate structure 140 is formed in the trench 130, in accordance with some embodiments. The gate structure 140 includes a gate dielectric layer 134 and a gate electrode layer 138.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials.

In some embodiments, the gate structure 140 further includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 1J:
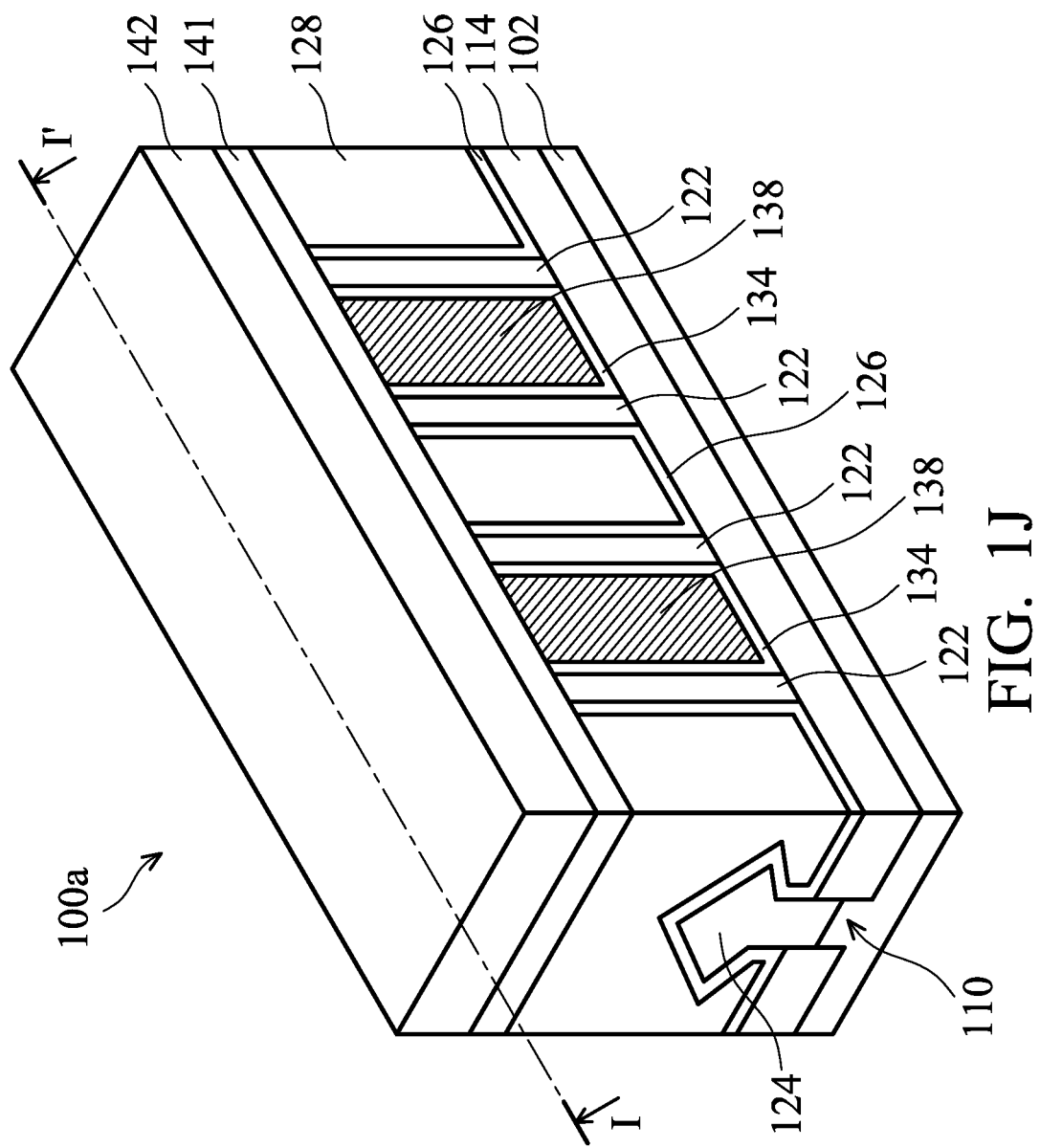

Next, as shown in FIG. 1J, a first etching stop layer 141 is formed over the gate structure 140 and over the first ILD layer 128, and a second ILD layer 142 is formed over the first etching stop layer 141, in accordance with some embodiments.

The first etching stop layer 141 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the first etching stop layer 141 is formed by performing a deposition process, such as an atomic layer deposition (ALD) process, a chemical vapor deposition (CVD) process, a physical vapor deposition (PVD) process, or another applicable process.

The second ILD layer 142 may be a single layer or multiple layers. The second ILD layer 142 is made of silicon oxide (SiOx), silicon nitride (SixNy), silicon oxynitride (SiON), dielectric material(s) with low dielectric constant (low-k), or combinations thereof. In some embodiments, the second ILD layer 142 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$). In some embodiments, the second ILD layer 142 is deposited by a plasma enhanced chemical vapor deposition (PECVD) process or by a spin coating process.

Figure 2A:
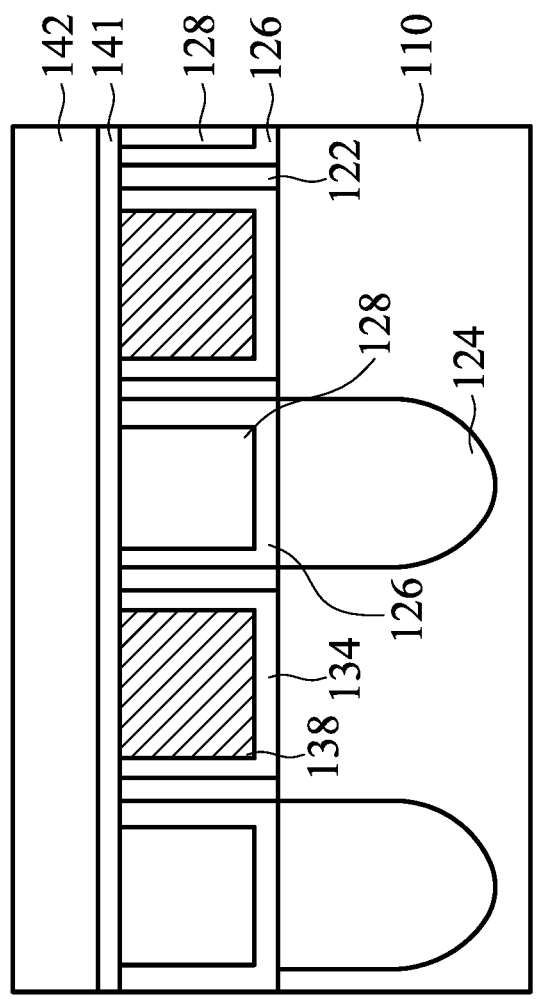
FIGS. 2A-2O show cross-sectional representations of various stages of forming a FinFET device structure after the structure of FIG. 1J, in accordance with some embodiments of the disclosure.
Figure 2B:
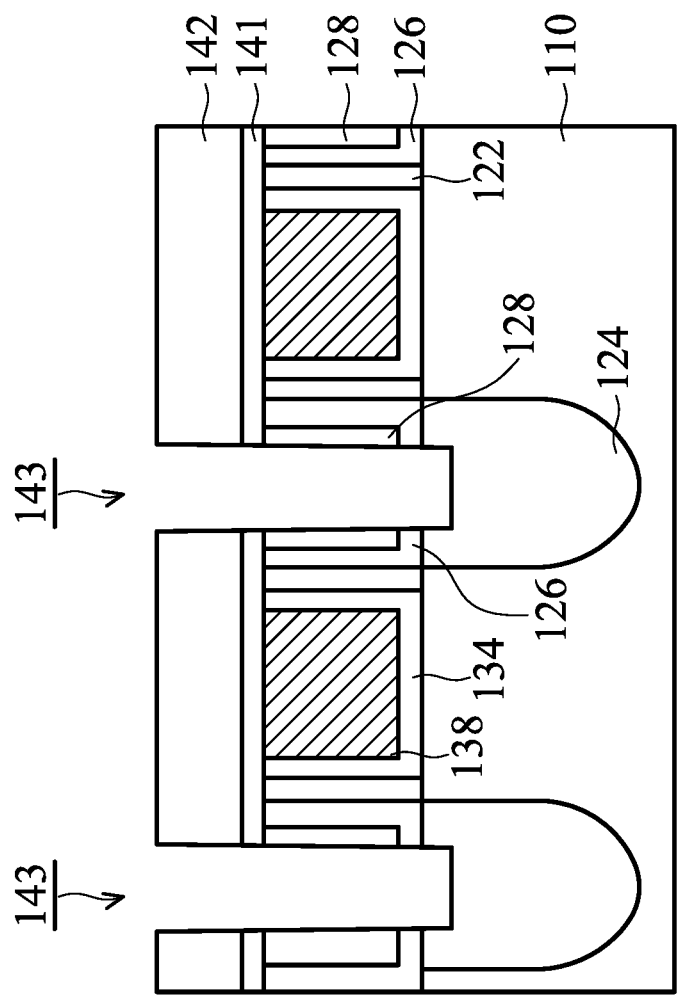
Figure 2C:
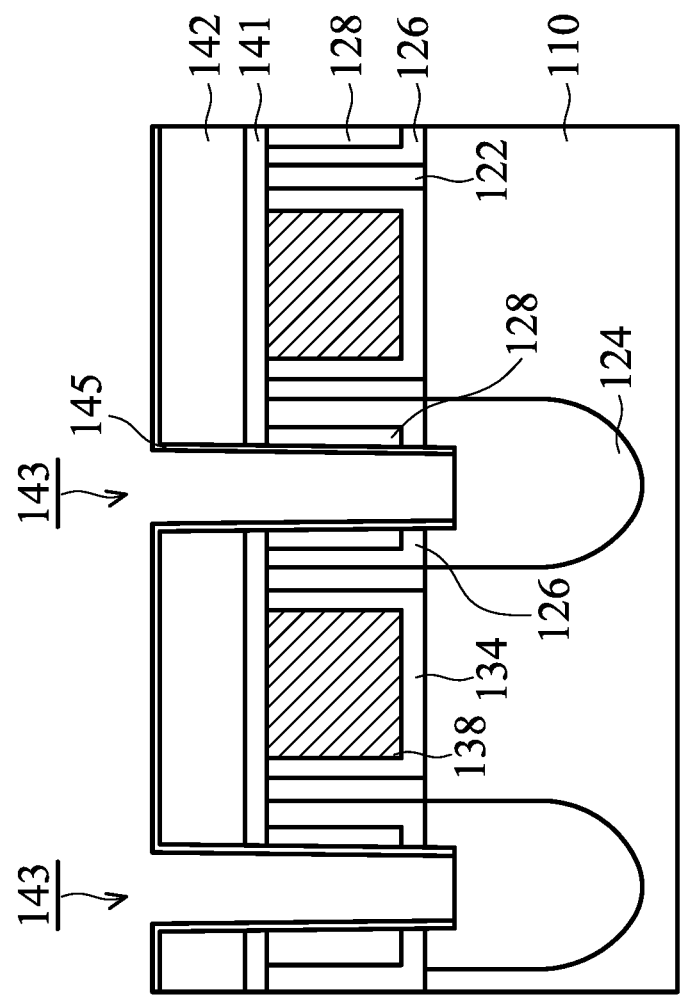
Figure 2D:
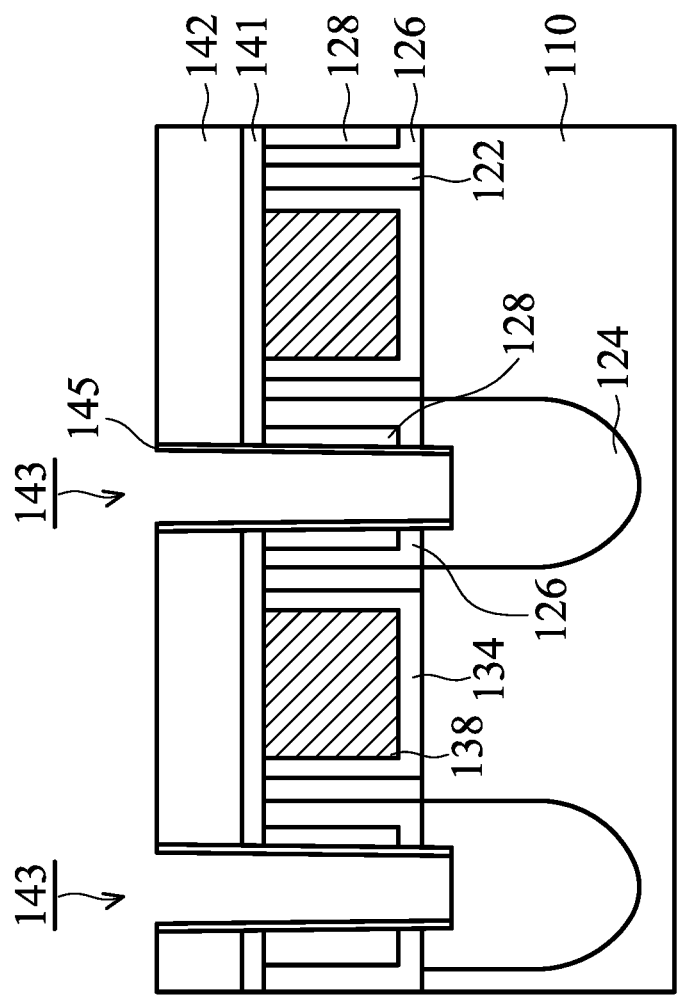
Figure 2E:
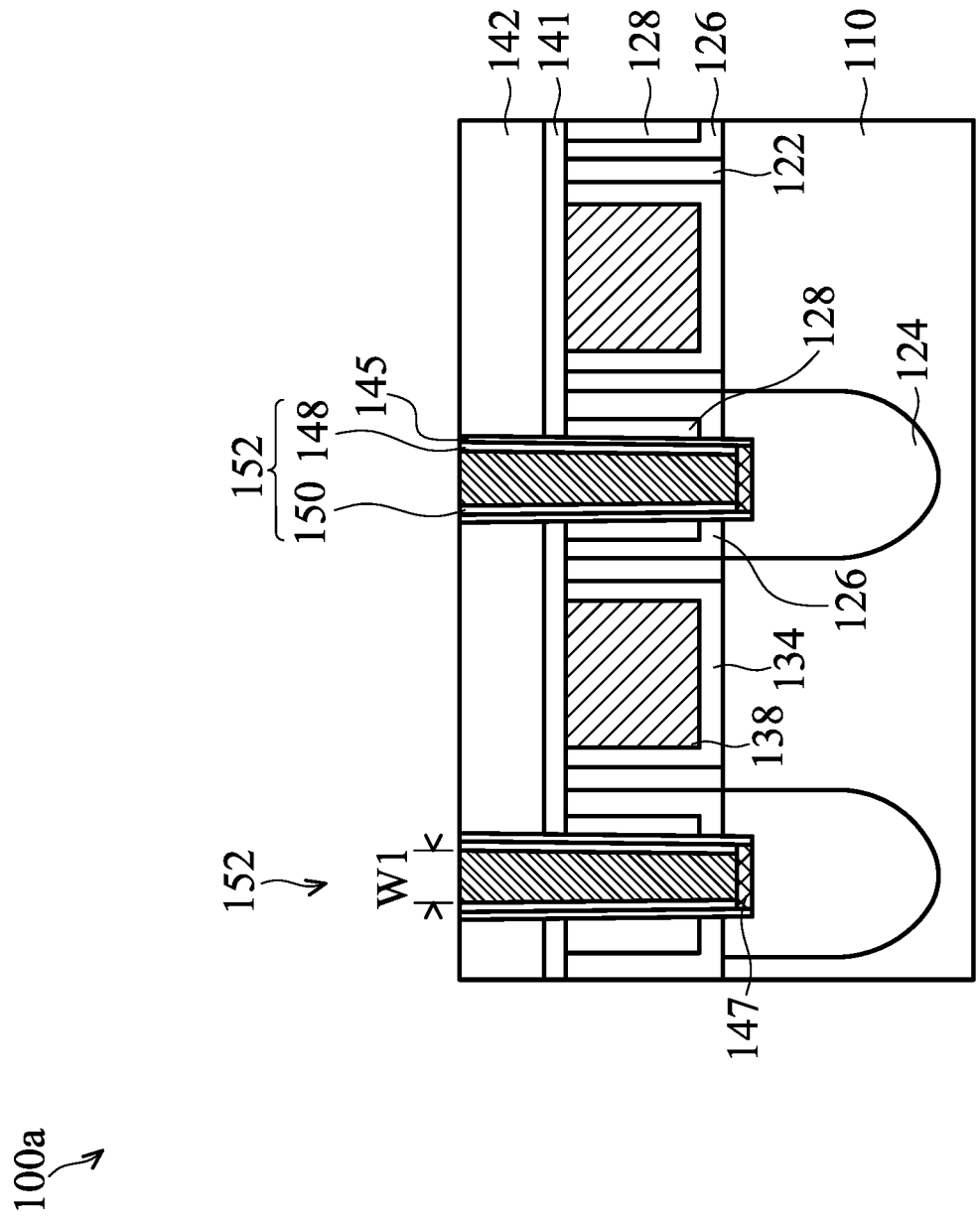
Figure 2F:
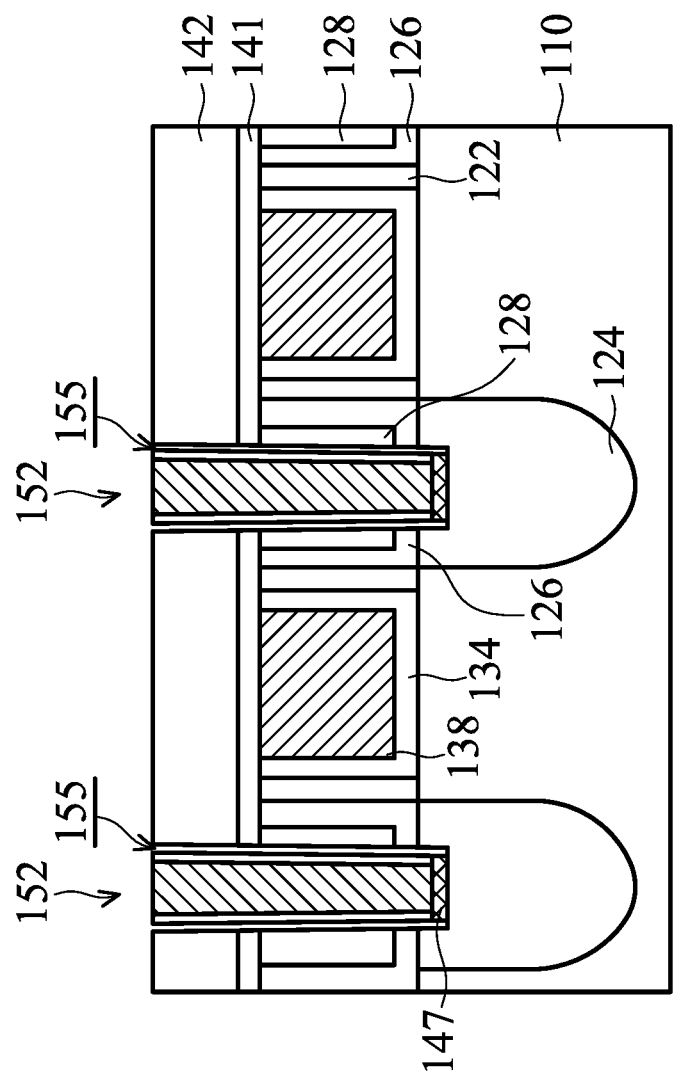
Figure 2G:
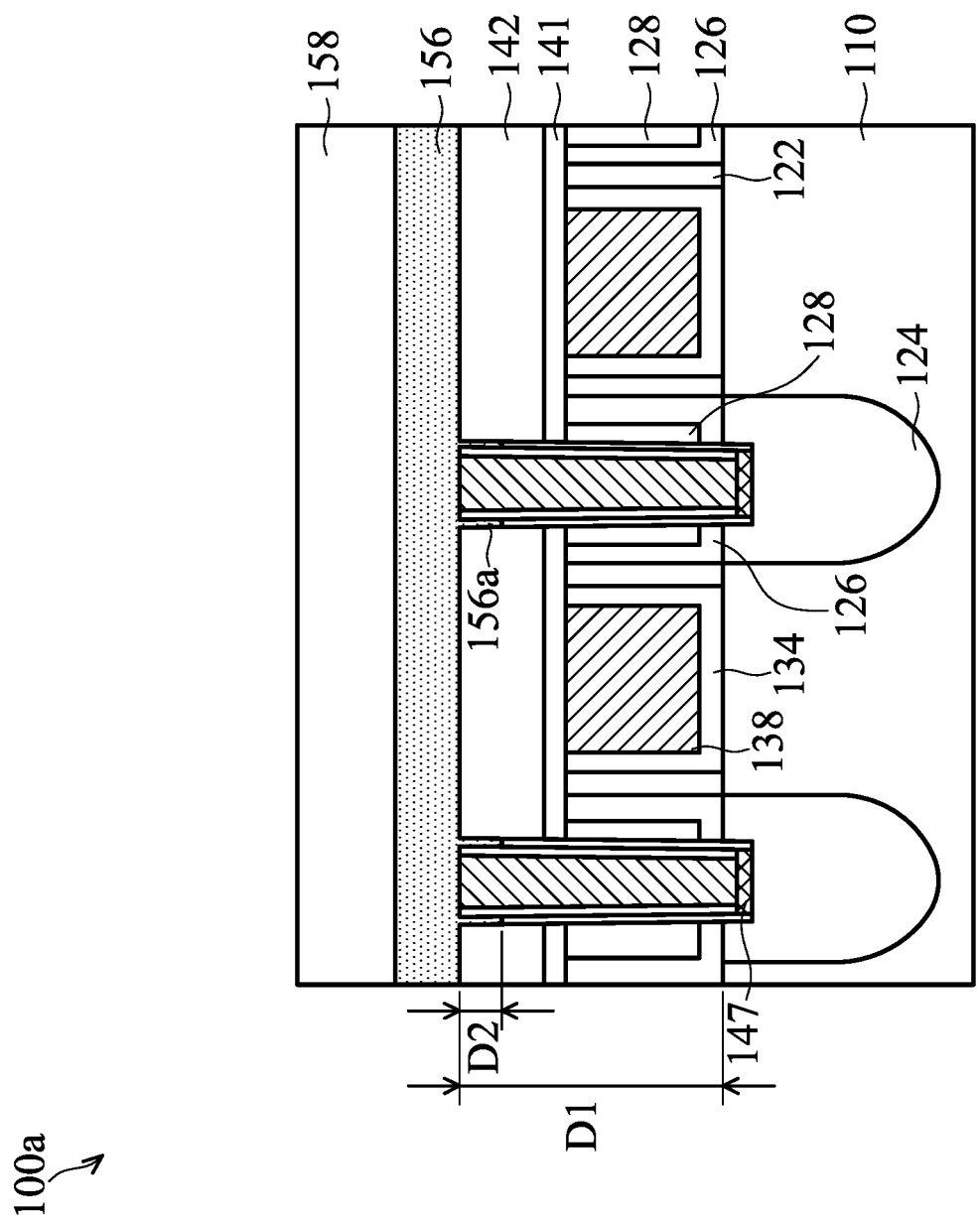
Figure 2H:
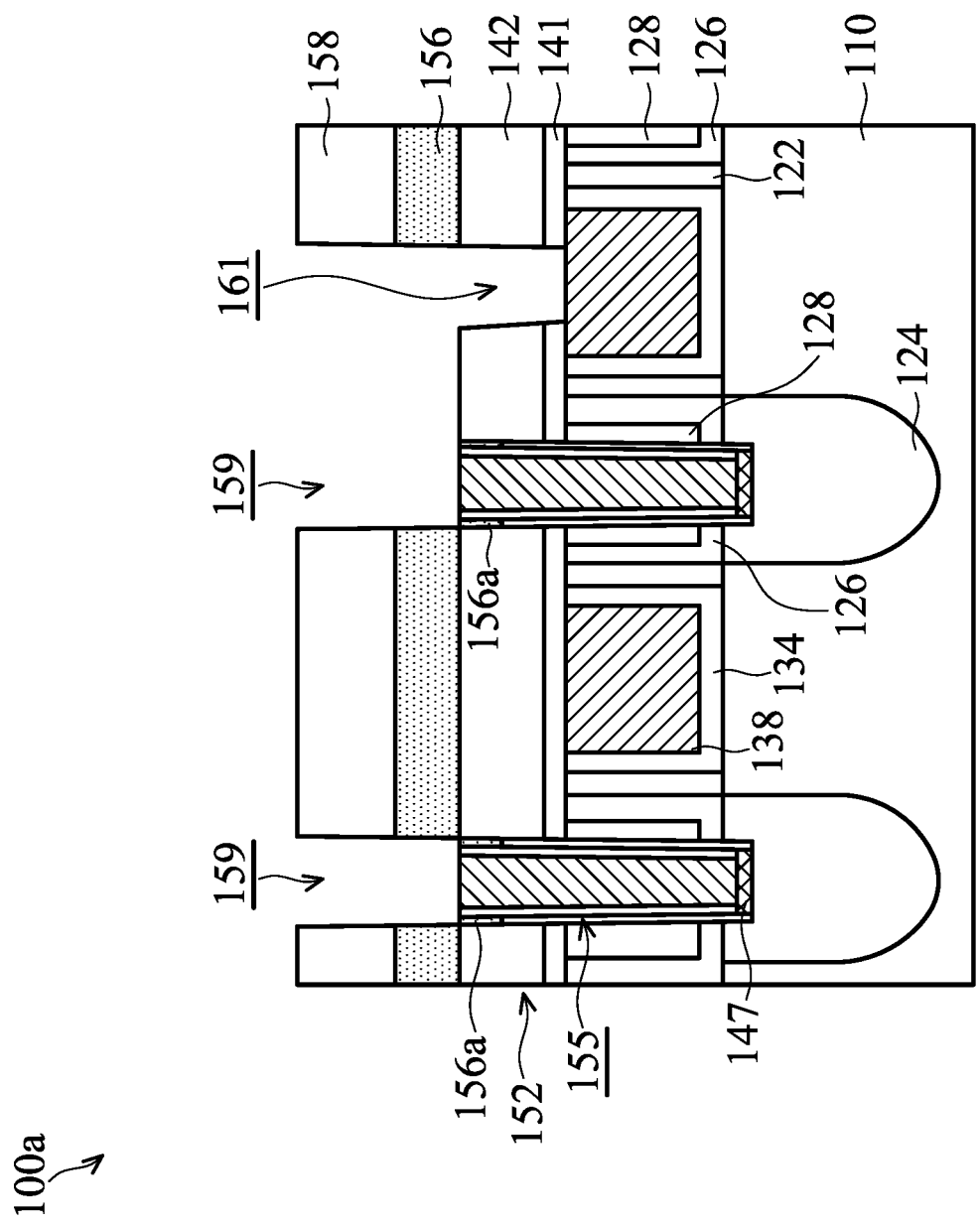
Figure 2I:
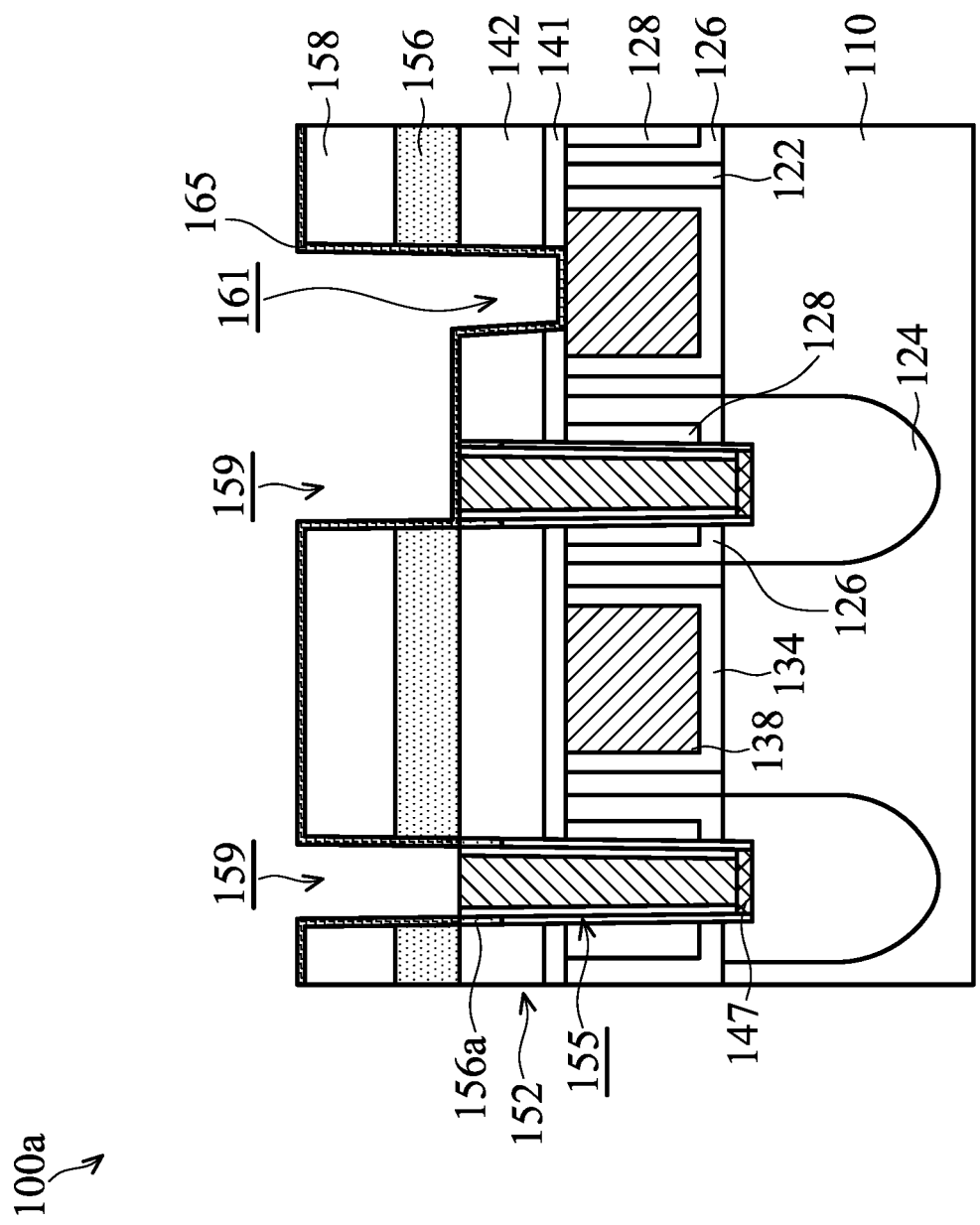
Figure 2J:
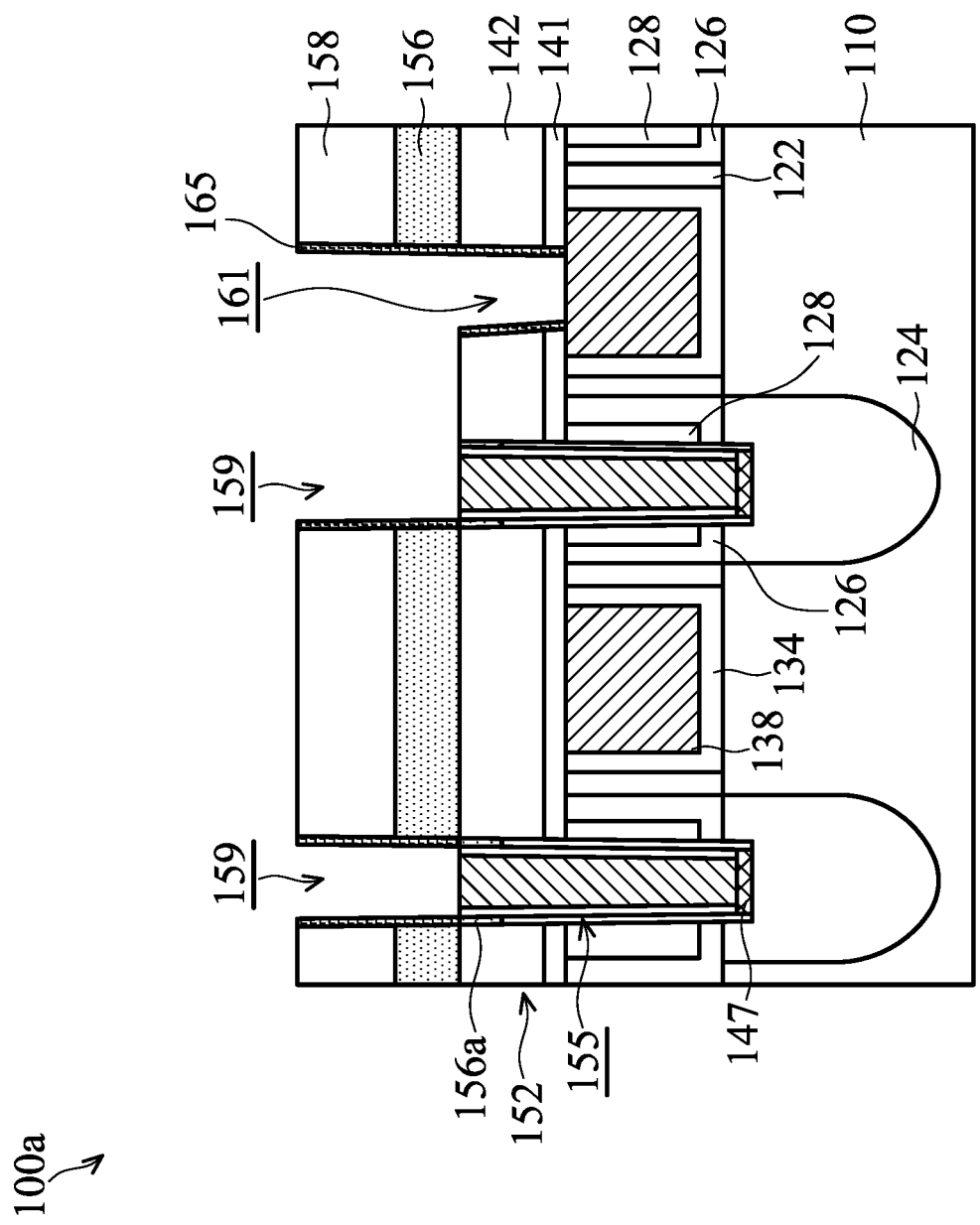
Figure 2K:
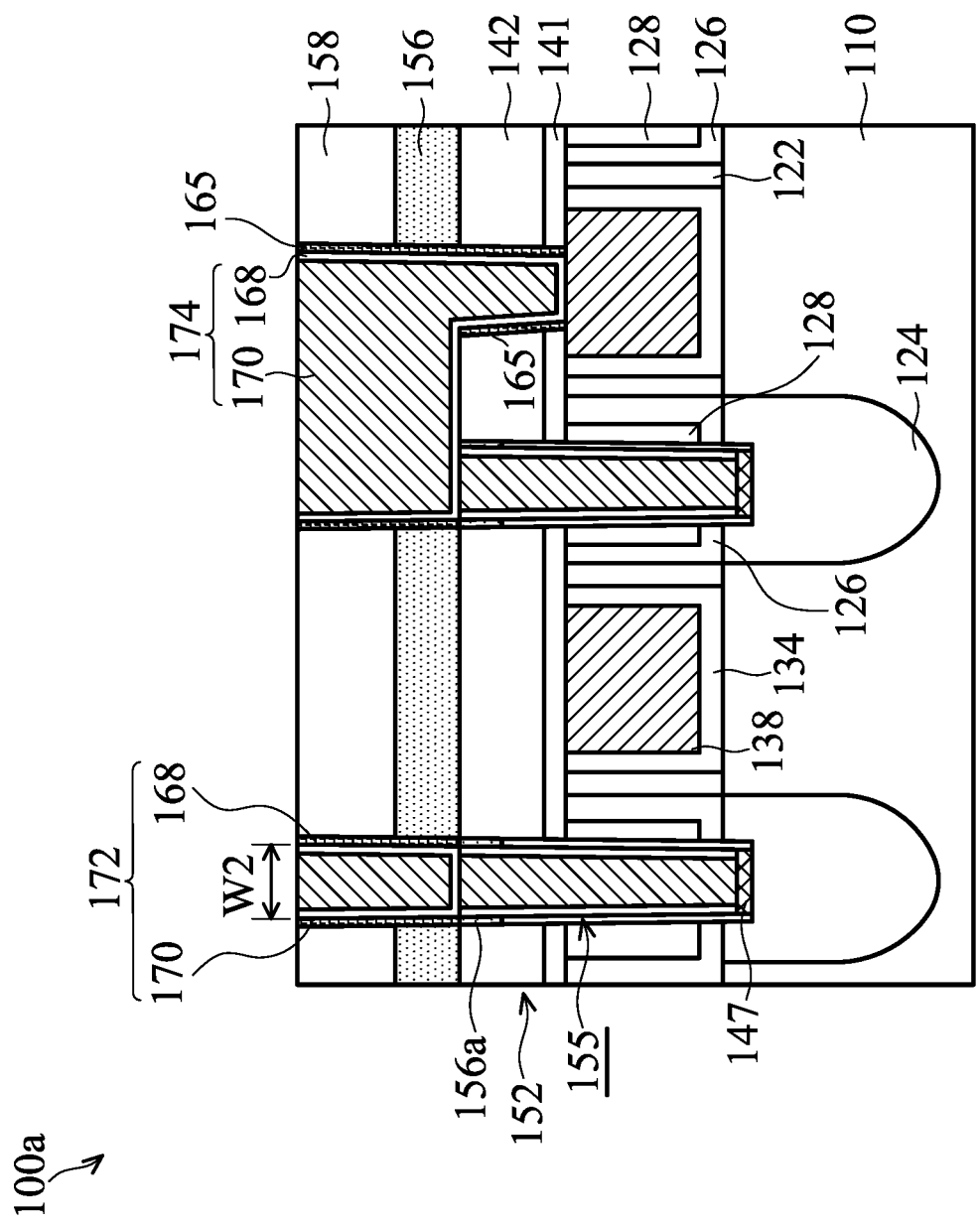
Figure 2L:
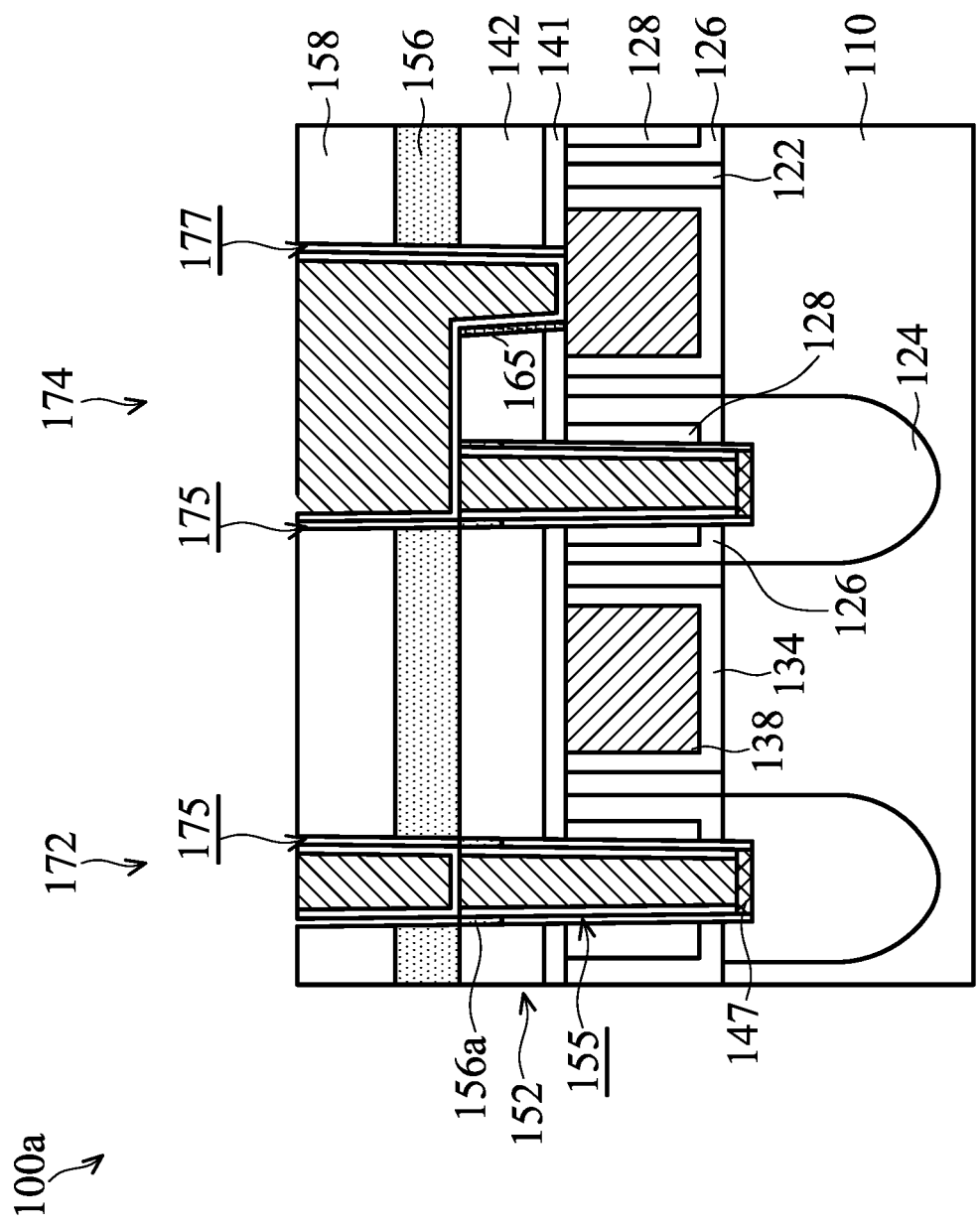
Figure 2M:
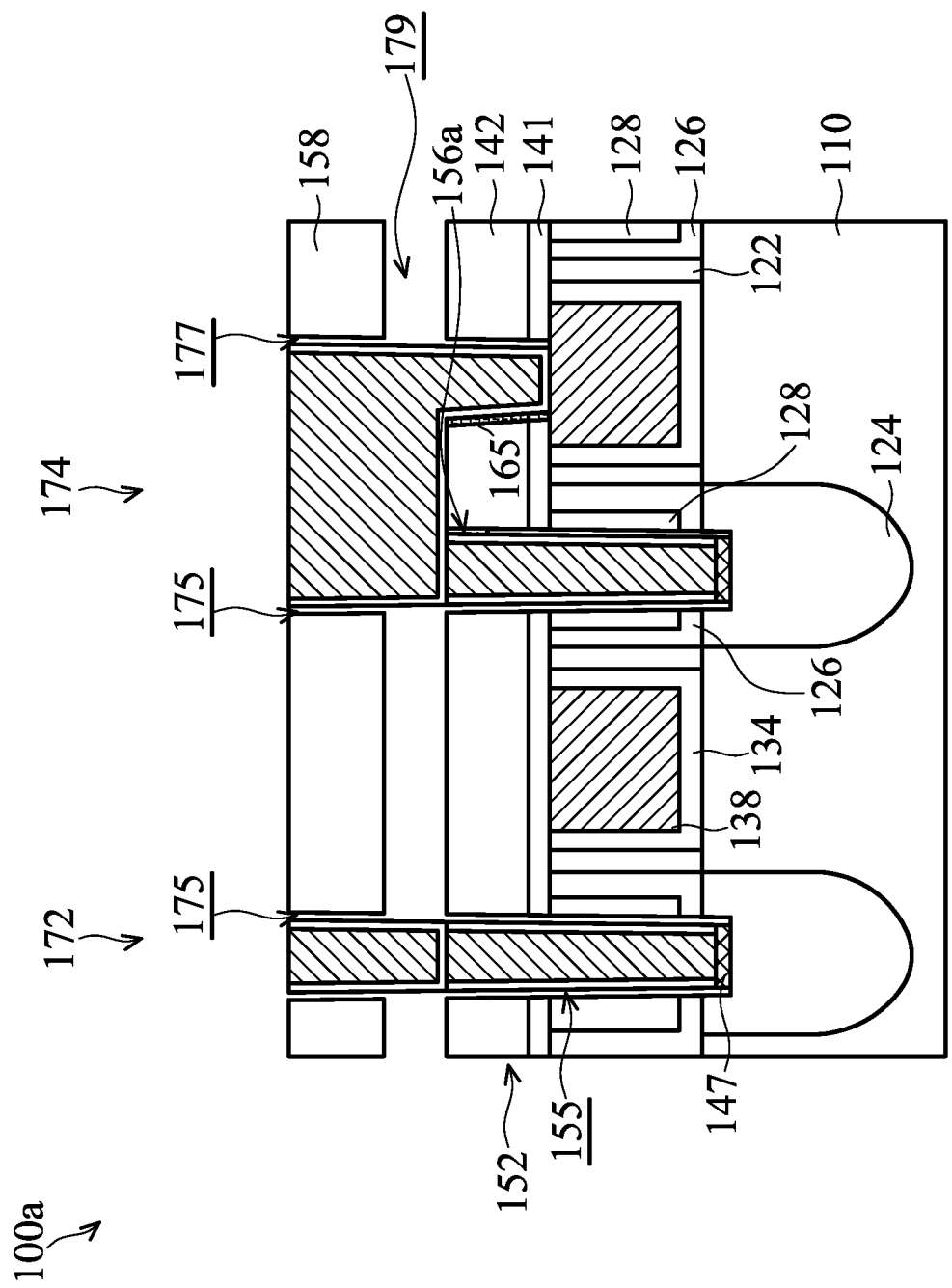
Figure 2N:
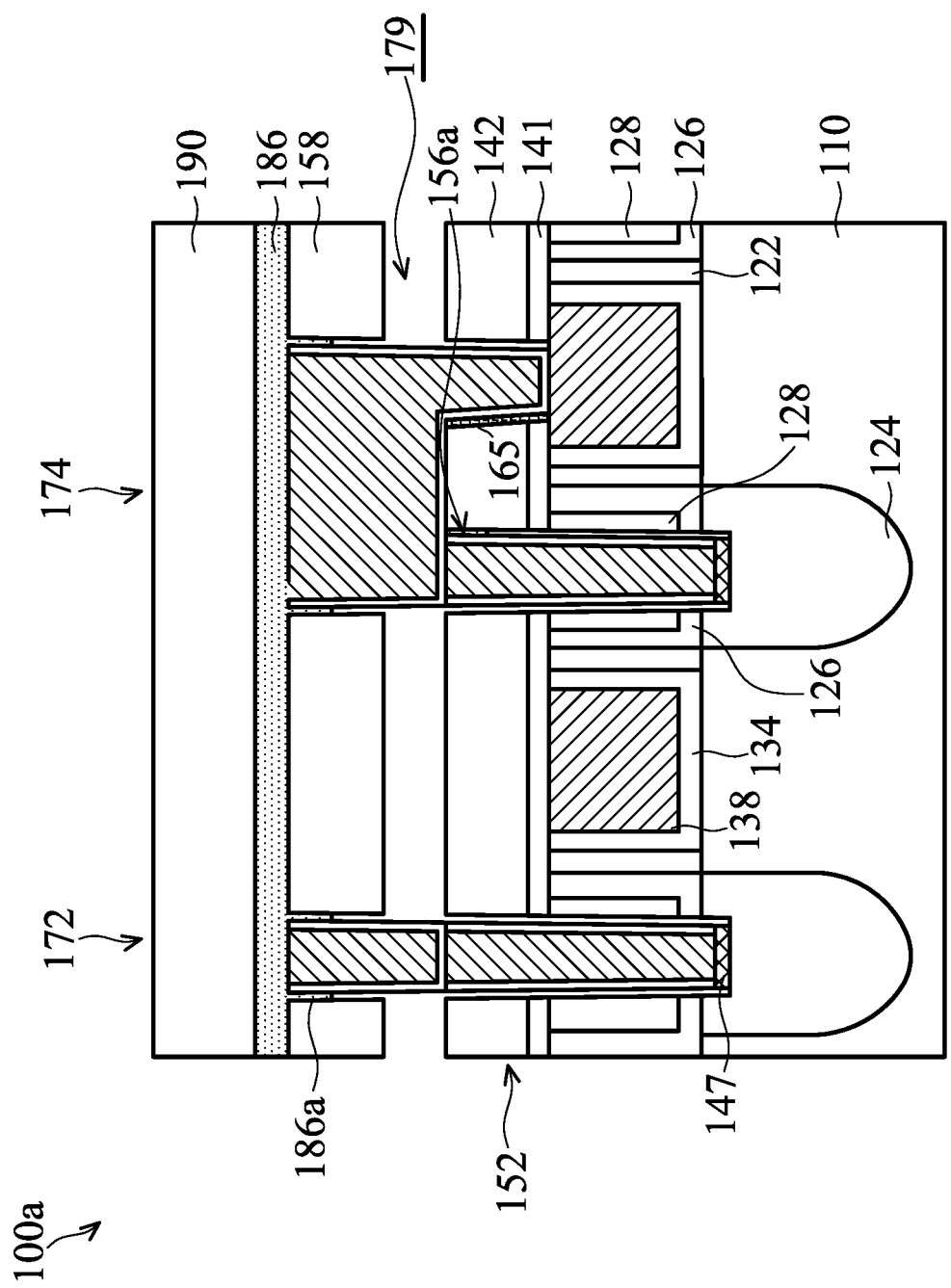
Figure 2O:
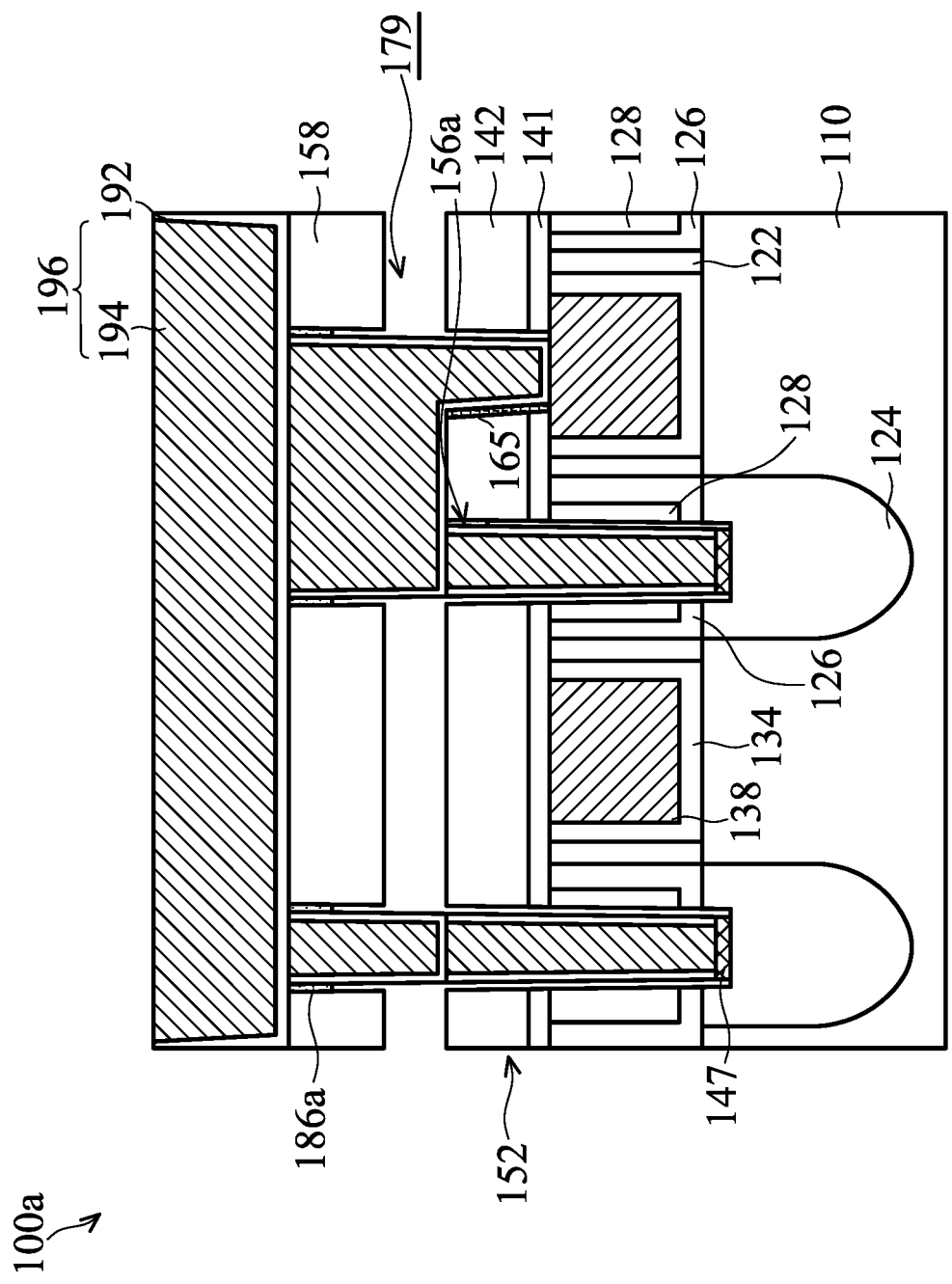

FIGS. 2A-2O show cross-sectional representations of various stages of forming a FinFET device structure 100a after the structure of FIG. 1J, in accordance with some embodiments of the disclosure. FIG. 2A is a cross-sectional representation taken along line I-I' of FIG. 1J.

As shown in FIG. 2A, the first etching stop layer 141 is formed over the gate structure 140 and over the first ILD layer 128, and the second ILD layer 142 is formed over the first etching stop layer 141.

Next, as shown in FIG. 2B, a first trench 143 is formed through the second ILD layer 142, the etching stop layer 141 and the first ILD layer 128, in accordance with some embodiments of the disclosure. As a result, a portion of the S/D structure 124 is exposed. In some embodiments, the bottom surface of the first trench 143 is lower than the top surface of the fin 110.

Afterwards, as shown in FIG. 2C, a first sacrificial layer 145 is formed in the first trench 143 and on the second ILD layer 142, in accordance with some embodiments of the disclosure.

The first sacrificial layer 145 will be removed in the flowing process. In some embodiments, the first sacrificial layer 145 includes a dielectric material having a composition different from its surrounding material layers, such that the first sacrificial layer 145 is selectively etched with respect to the first ILD layer 128, the etching stop layer 141, and the second ILD layer 142 in a subsequent processing step. In other words, the etching selectivity of the first ILD layer 128, the etching stop layer 141, and the second ILD layer 142 with respect to the first sacrificial layer 145 is relatively high. Therefore, the first sacrificial layer 145 is removed by the etching process while the first ILD layer 128, the etching stop layer 141, and the second ILD layer 142 may be substantially left. In some embodiments, the first sacrificial layer 145 includes silicon nitride, silicon oxynitride, and/or other applicable materials. In some embodiments, the first sacrificial layer 145 is formed by a deposition process, such as a chemical vapor deposition (CVD) process, physical vapor deposition (PVD) process, atomic layer deposition (ALD) process, or another application process.

The term of "selectivity" or "etching selectivity" is defined as the ratio of etching rate of one material (the reference material) relative to another material (the material of interest). An increase in etching selectivity means that the selected material, or material of interest, is harder to etch. A decrease in etching selectivity means that the selected material is easier to etch. More specifically, the high etching selectivity of the first ILD layer 128 and the second ILD layer 142 means that the first ILD layer 128 and the second ILD layer 142 are not easy to damage or etch during the etching process of the first sacrificial layer 145.

Afterwards, as shown in FIG. 2D, a portion of the first sacrificial layer 145 is removed, in accordance with some embodiments of the disclosure. In some embodiments, the horizontal portion of the first sacrificial layer 145 is removed, but the vertical portion of the first sacrificial layer 145 is left.

Afterwards, as shown in FIG. 2E, a metal silicide layer 147 is formed on the S/D structure 124, and a first S/D contact structure 152 is formed on the metal silicide layer 173, in accordance with some embodiments of the disclosure.

The metal silicide layer 147 is used to reduce contact resistance (Rcsd) between the first S/D contact structure 152 and the S/D structure 124. In some other embodiments, the metal silicide layer 147 is made of titanium silicide (TiSix). In some other embodiments, the metal silicide layer 147 is made of or tantalum silicide (TaSix).

The first S/D contact structure 152 includes a barrier layer 148 and a conductive layer 150 formed on the barrier layer 148. In some embodiments, the barrier layer 148 has a U-shaped structure. In some embodiments, the barrier layer 148 includes one layer or multiple layers. The first S/D contact structure 152 has a first width $W_1$ in a horizontal direction.

In some embodiments, the barrier layer 148 is made of tantalum (Ta), tantalum nitride (TaN), titanium (Ti), titanium nitride (TiN), cobalt tungsten (CoW) or another applicable material. In some embodiments, the barrier layer 148 is formed by a deposition process, such as a chemical vapor deposition (CVD) process, physical vapor deposition (PVD) process, atomic layer deposition (ALD) process, plating process or another application process. In some embodiments, the conductive layer 150 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive layer 150 is formed by a deposition process, such as a chemical vapor deposition (CVD) process, physical vapor deposition (PVD) process, atomic layer deposition (ALD) process, plating process or another application process.

Afterwards, as shown in FIG. 2F, the first sacrificial layer 145 is removed to form a first air gap 155, in accordance with some embodiments of the disclosure. The first air gap 155 is used to reduce the parasitic capacitance. The first air gap 155 is formed on the sidewall of the first S/D contact structure 152. In addition, the first air gap 155 is in direct contact with the first ILD layer 128 and the second ILD layer 142. The metal silicide layer 147 is in direct contact with the first air gap 155.

Next, as shown in FIG. 2G, a first sealing layer 156 is formed over the second ILD layer 142, and a third ILD layer 158 is formed on the first sealing layer 156, in accordance with some embodiments of the disclosure.

Since the first air gap 155 is empty, a portion of the first sealing layer 156 is formed in the first air gap 155 while forming the first sealing layer 156. Therefore, the first sealing layer 156 includes an extending portion 156a which is in the first air gap 155. In some embodiments, the bottom surface of the extending portion 156a of the first sealing layer 156 is lower than the top surface of the first S/D contact structure 152. In addition, the first sealing layer 156 is between the first S/D contact structure 152 and the second ILD layer 142.

In some embodiments, the first sealing layer 156 is made of includes silicon nitride, silicon oxynitride, and/or other applicable materials. In some embodiments, the first sealing layer 156 is formed by a deposition process, such as a chemical vapor deposition (CVD) process, physical vapor deposition (PVD) process, atomic layer deposition (ALD) process, or another application process. The etching selectivity of the second ILD layer 142 and the third ILD layer 158 with respect to the first sealing layer 156 is relatively high. Therefore, the first sealing layer 156 is removed by the etching process (in FIG. 2M) while the second ILD layer 142, and the third ILD layer 158 may be substantially left.

The first S/D contact structure 152 has a first depth $D_1$, and the extending portion 156a of the first sealing layer 156 has a second depth $D_2$. The second depth $D_2$ is smaller than the first depth $D_1$. In some embodiments, the first depth $D_1$ is in a range from about 15 nm to about 40 nm. In some embodiments, the second depth $D_2$ is in a range from about 1 nm to about 5 nm. In some embodiments, the ratio of the second depth $D_2$ to the first depth $D_1$ is in a range from about 0.025 to about 0.3. If the ratio is not within the above-mentioned range, the capacitances between the S/D contact structure and ILD layer may not be reduced efficiently as well.

Afterwards, as shown in FIG. 2H, a portion of the third ILD layer 158, a portion of the first sealing layer 156 are removed to form a second trench 159, in accordance with some embodiments of the disclosure. Next, a portion of the second ILD layer 142 and the etching stop layer 141 are sequentially removed to form a third trench 161. The third trench 161 is deeper than the second trench 159. In some embodiments, the second trench 159 is connected to the third trench 161.

The top surface of the first S/D contact structure 152 is exposed by the second trench 159, and the top surface of the extending portion 156a of the first sealing layer 156 is also exposed by the second trench 159. The top surface of the gate structure 140 is exposed by the third trench 161.

Afterwards, as shown in FIG. 2I, a second sacrificial layer 165 is formed in the second trench 159 and the third trench 161, and over the third ILD layer 158, in accordance with some embodiments of the disclosure. In addition, the second sacrificial layer 165 is formed over the extending portion 156a of the first sealing layer 156.

In some embodiments, the material of the second sacrificial layer 165 is different from that of the first sacrificial layer 145. In some embodiments, the material of the second sacrificial layer 165 is different from that of the first sealing layer 156.

Afterwards, as shown in FIG. 2J, a portion of the second sacrificial layer 165 is removed, in accordance with some embodiments of the disclosure. The horizontal portion of the second sacrificial layer 165 is removed, but the vertical portion of the second sacrificial layer 165 is left. Therefore, the top surface of the extending portion 156a of the first sealing layer 156 is exposed.

Afterwards, as shown in FIG. 2K, a second S/D contact structure 172 and a gate contact structure 174 are formed, in accordance with some embodiments of the disclosure. The second S/D contact structure 172 is directly over the first S/D contact structure 152. The gate contact structure 174 is directly over the gate structure 140.

The second S/D contact structure 172 includes a barrier layer 168 and a conductive layer 170 formed over the barrier layer 168. The gate contact structure 174 includes the barrier layer 168 and the conductive layer 170 formed over the barrier layer 168. The gate contact structure 174 includes an extending portion which is directly over the first S/D contact structure 152. In some embodiments, a portion of the gate contact structure 174 is in direct contact with the first S/D contact structure 152 and the extending portion 156a of the first sealing layer 156.

The second S/D contact structure 172 has a second width $W_2$ in a horizontal direction. In some embodiments, the first width $W_1$ of the first S/D contact structure 152 (shown in FIG. 2E) is the same as the second width $W_2$ of the second S/D contact structure 172.

Afterwards, as shown in FIG. 2L, a portion of the second sacrificial layer 165 is removed to form a second air gap 175 and a third air gap 177, in accordance with some embodiments of the disclosure. The second air gap 175 is formed on the sidewall of the second S/D contact structure 172, and the third air gap 177 is formed on the sidewall of the gate contact structure 174.

In some embodiments, the second air gap 175 is directly over the first air gap 155. In some embodiments, the second air gap 175 is substantially aligned with the first air gap 155. In some embodiments, the extending portion 156a of the first sealing layer 156 is between the first air gap 155 and the second air gap 175. The second air gap 175 is in direct contact with the extending portion 156a of the first sealing layer 156 and the third ILD layer 158. In some embodiments, the third air gap 177 is directly over the gate structure 140.

It should be noted that a portion of the second sacrificial layer 165 which is below the gate contact structure 174 is not removed. The remaining second sacrificial layer 165 is between the gate contact structure 174 and the second ILD layer 142.

Afterwards, as shown in FIG. 2M, a portion of the first sealing layer 156 is removed, in accordance with some embodiments of the disclosure. As a result, an air gap layer 179 is formed between the second ILD layer 142 and the third ILD layer 158. The second air gap 175 is connected to the first air gap 155 through the air gap layer 179, and the third air gap 177 is connected to the air gap layer 179. In some other embodiments, the portion of the first sealing layer 156 is not removed, and air gap layer 179 is not formed.

As mentioned above, the etching selectivity of the second ILD layer 142 and the third ILD layer 158 with respect to the first sealing layer 156 is relatively high. Therefore, the first sealing layer 156 is removed by the etching process (in FIG. 2M) while the second ILD layer 142, and the third ILD layer 158 may be substantially left.

Afterwards, as shown in FIG. 2N, a second sealing layer 186 is formed over the third ILD layer 158, and a fourth ILD layer 190 is formed over the second sealing layer 186, in accordance with some embodiments of the disclosure.

Since the second air gap 175 and the third air gap 177 are empty, a portion of the second sealing layer 186 is formed in the second air gap 175 and the third air gap 177 while forming the second sealing layer 186. Therefore, the second sealing layer 186 includes an extending portion 186a which is formed in the second air gap 175 and the third air gap 177. In some embodiments, the bottom surface of the extending portion 186a of the second sealing layer 186 is lower than the top surface of the second S/D contact structure 172 and the top surface of the gate contact structure 174.

Afterwards, as shown in FIG. 2O, a portion of the fourth ILD layer 190 and a portion of the second sealing layer 186 are removed to form a recess (not shown), and a conductive line 196 is formed in the recess, in accordance with some embodiments of the disclosure. The conductive line 196 include a barrier layer 192 and the conductive layer 194 formed over the barrier layer 192.

The first air gap 155 is between the first S/D contact structure 152 and the first ILD layer 128, the second air gap 175 is between the second S/D contact structure 172 and the third ILD layer 158, such that the parasitic capacitance between the first S/D contact structure 152/the second SID contact structure 1272 and the second ILD layer 142/the third ILD layer 158 is reduced. Therefore, the performance of the FinFET device structure 100a is improved.

FIGS. 3A-3D show a cross-sectional representations of a FinFET device structure 100b, in accordance with some embodiments of the disclosure. Some processes and materials used to form the FinFET device structure 100b in FIGS. 3A-3D are similar to, or the same as, those used to form the FinFET device structure 100a in FIGS. 2A-2O and are not repeated herein.

Figure 3A:
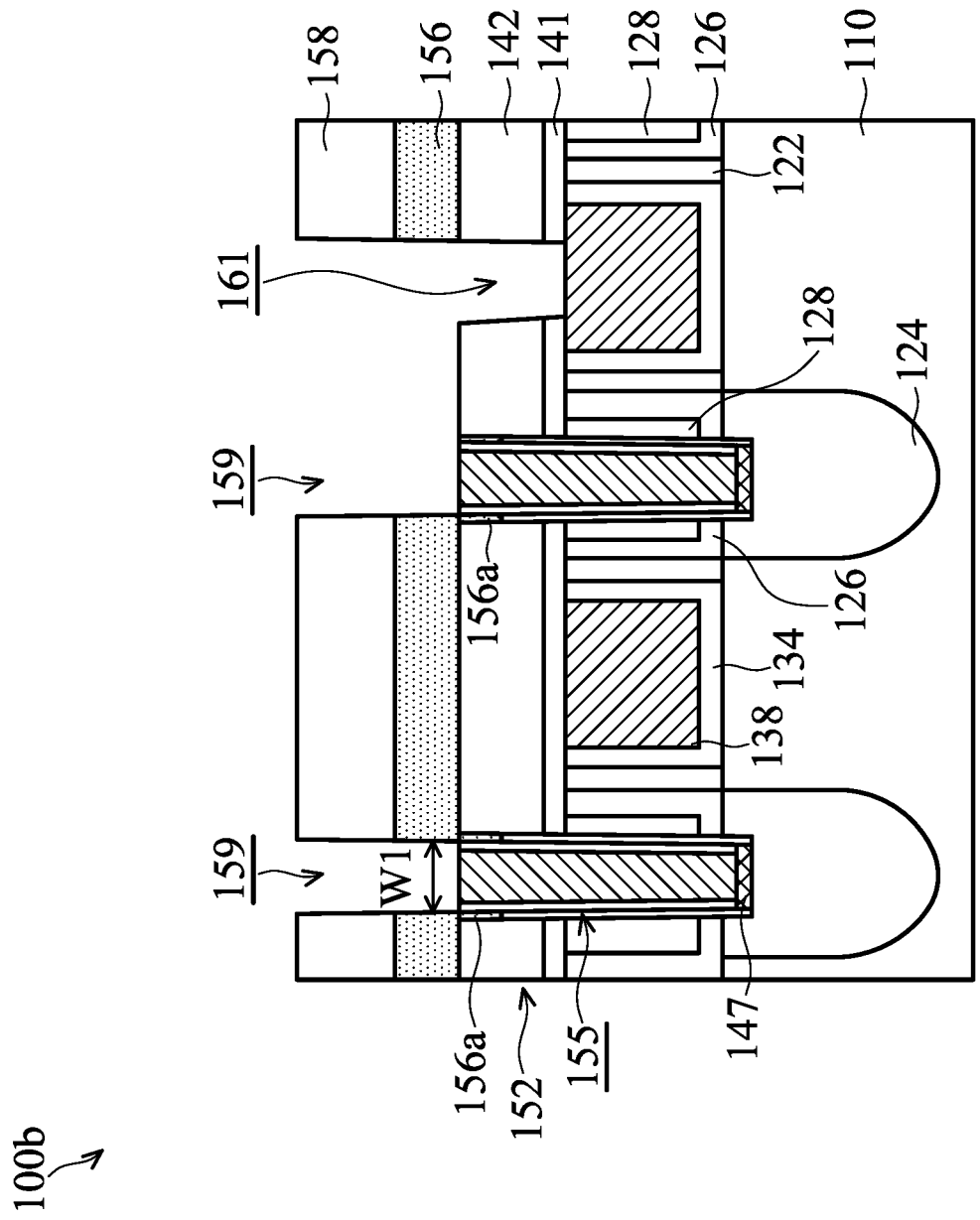
FIGS. 3A-3D show a cross-sectional representations of a FinFET device structure, in accordance with some embodiments of the disclosure.

As shown in FIG. 3A, the second trench 159 and the third trench 161 are formed, in accordance with some embodiments of the disclosure. The top surface of the first S/D contact structure 152 is exposed by the second trench 159, and the top surface of the extending portion 156a of the first sealing layer 156 is exposed. The top surface of the gate structure 140 is exposed by the third trench 161.

Figure 3B:
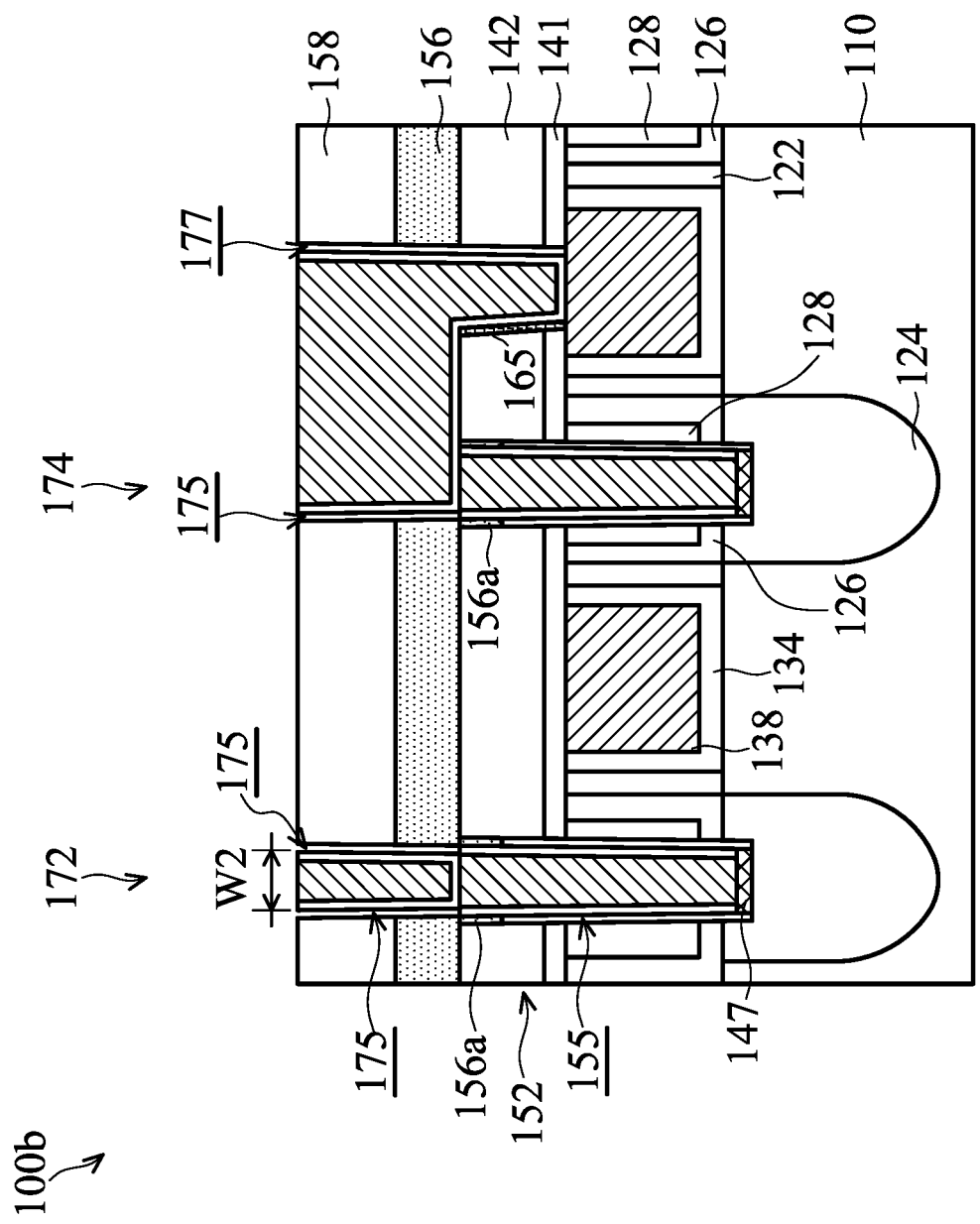

Afterwards, as shown in FIG. 3B, the second S/D contact structure 172 and the gate contact structure 174 are formed, in accordance with some embodiments of the disclosure. The second air gap 175 is formed on the sidewall of the second S/D contact structure 172, and the third air gap 177 is formed on the sidewall of the gate contact structure 174. The second air gap 175 is not aligned with the first air gap 155. In some embodiments, the bottom surface of the second air gap 175 is in direct contact with a portion of the first S/D contact structure 152. In some other embodiments, the bottom surface of the second air gap 175 is in direct contact with a portion of the extending portion 156a of the first sealing layer 156.

The first S/D contact structure 152 has the first width $W_1$, and the second contact structure 172 has the second width $W_2$. In some embodiments, the second width $W_2$ is smaller than the first width $W_1$.

Figure 3C:
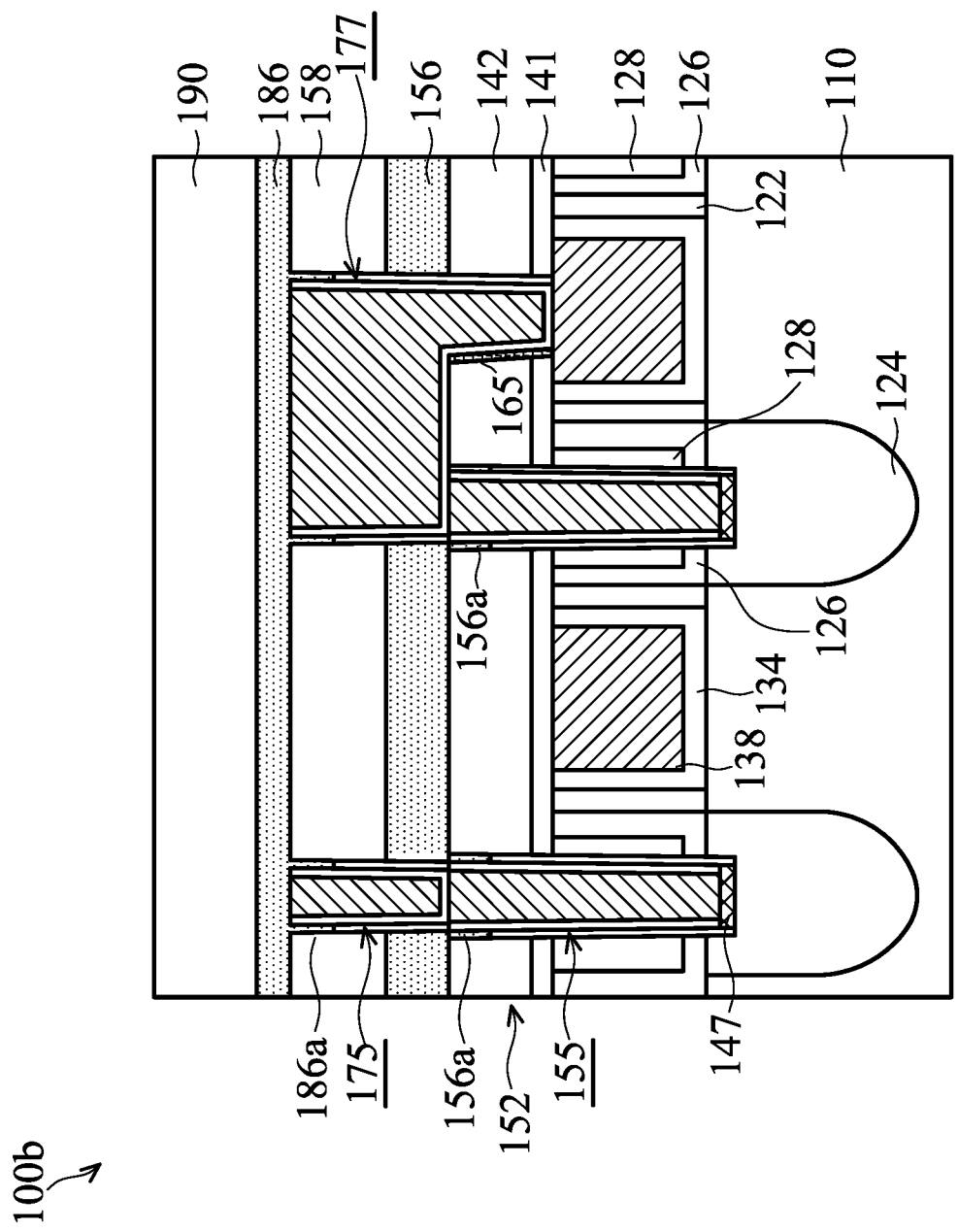

Afterwards, as shown in FIG. 3C, the second sealing layer 186 is formed over the third ILD layer 158, and the fourth ILD layer 190 is formed over the second sealing layer 186, in accordance with some embodiments of the disclosure. The extending portion 186a of the second sealing layer 186 is formed in the second air gap 175.

Figure 3D:
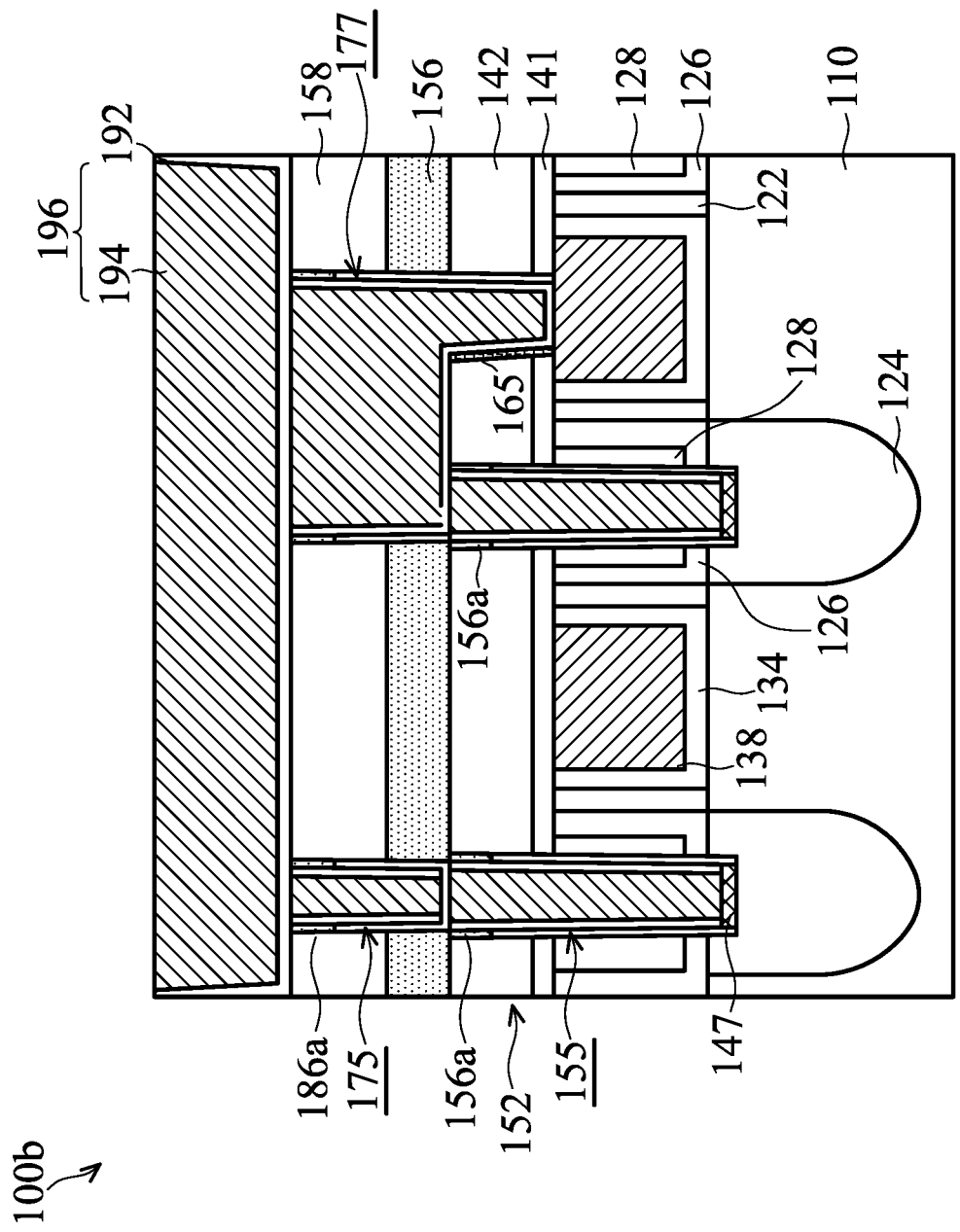

Afterwards, as shown in FIG. 3D, a portion of the second sealing layer 186 and a portion of the fourth ILD layer 190 are removed, and the conductive line 196 is formed, in accordance with some embodiments of the disclosure.

The FinFET device structure 100b in FIG. 3D is similar to the FinFET device structure 100a in FIG. 2O, the difference between FIG. 3D and FIG. 2O is that, the second S/D contact structure 172 is smaller than the first S/D contact structure 152 in FIG. 3D, and the second air gap 177 is not aligned with the first air gap 155.

FIGS. 4A-4D show a cross-sectional representations of a FinFET device structure 100c, in accordance with some embodiments of the disclosure. Some processes and materials used to form the FinFET device structure 100c in FIGS. 4A-4D are similar to, or the same as, those used to form the FinFET device structure 100a in FIGS. 2A-2O and are not repeated herein.

Figure 4A:
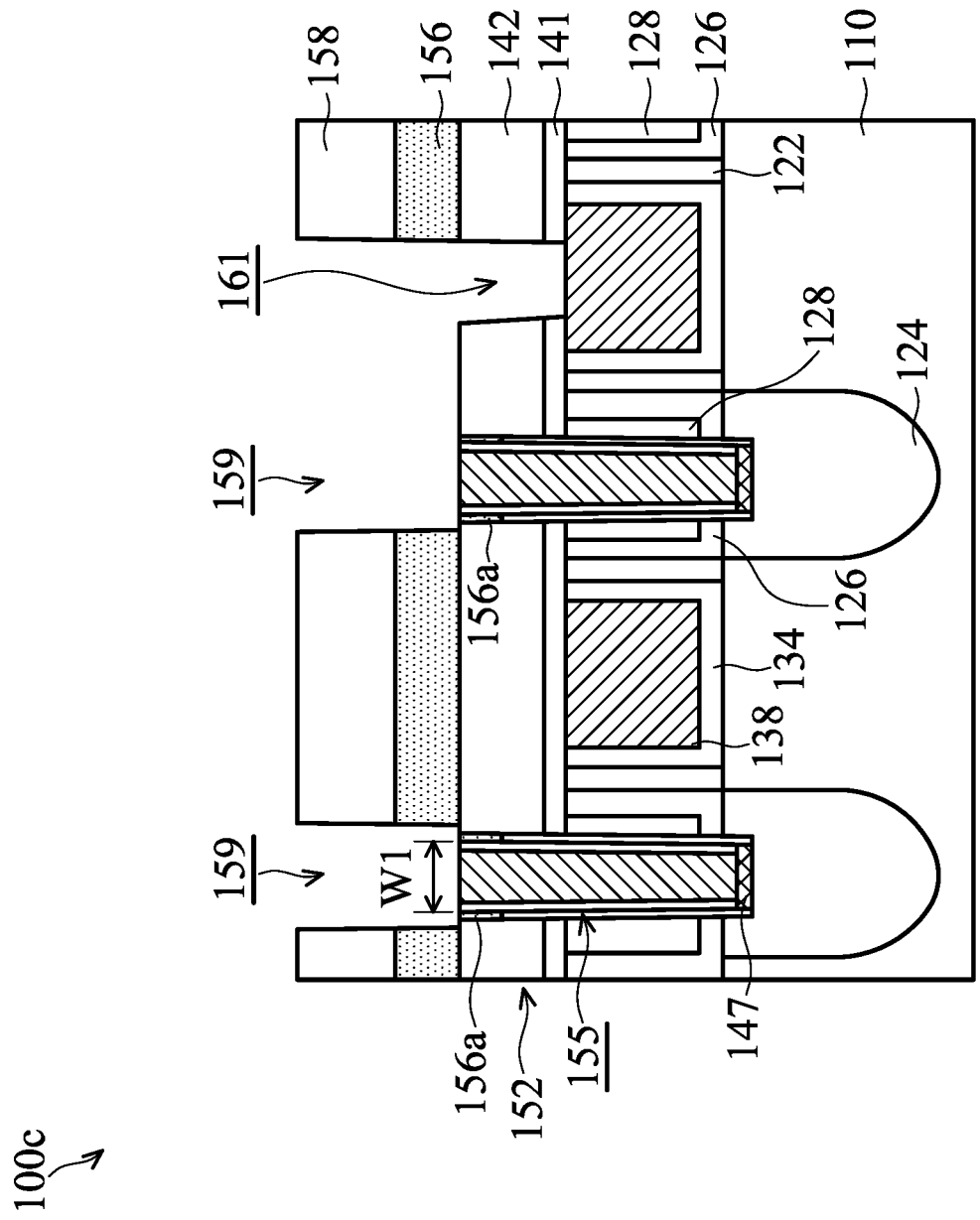
FIGS. 4A-4D show a cross-sectional representations of a FinFET device structure, in accordance with some embodiments of the disclosure.

As shown in FIG. 4A, the second trench 159 and the third trench 161 are formed, in accordance with some embodiments of the disclosure. The top surface of the first S/D contact structure 152 is exposed by the second trench 159, and the top surface of the extending portion 156a of the first sealing layer 156 is exposed. In addition, the top surface of the ILD layer 142 is exposed by the second trench 159. The top surface of the gate structure 140 is exposed by the third trench 161.

Figure 4B:
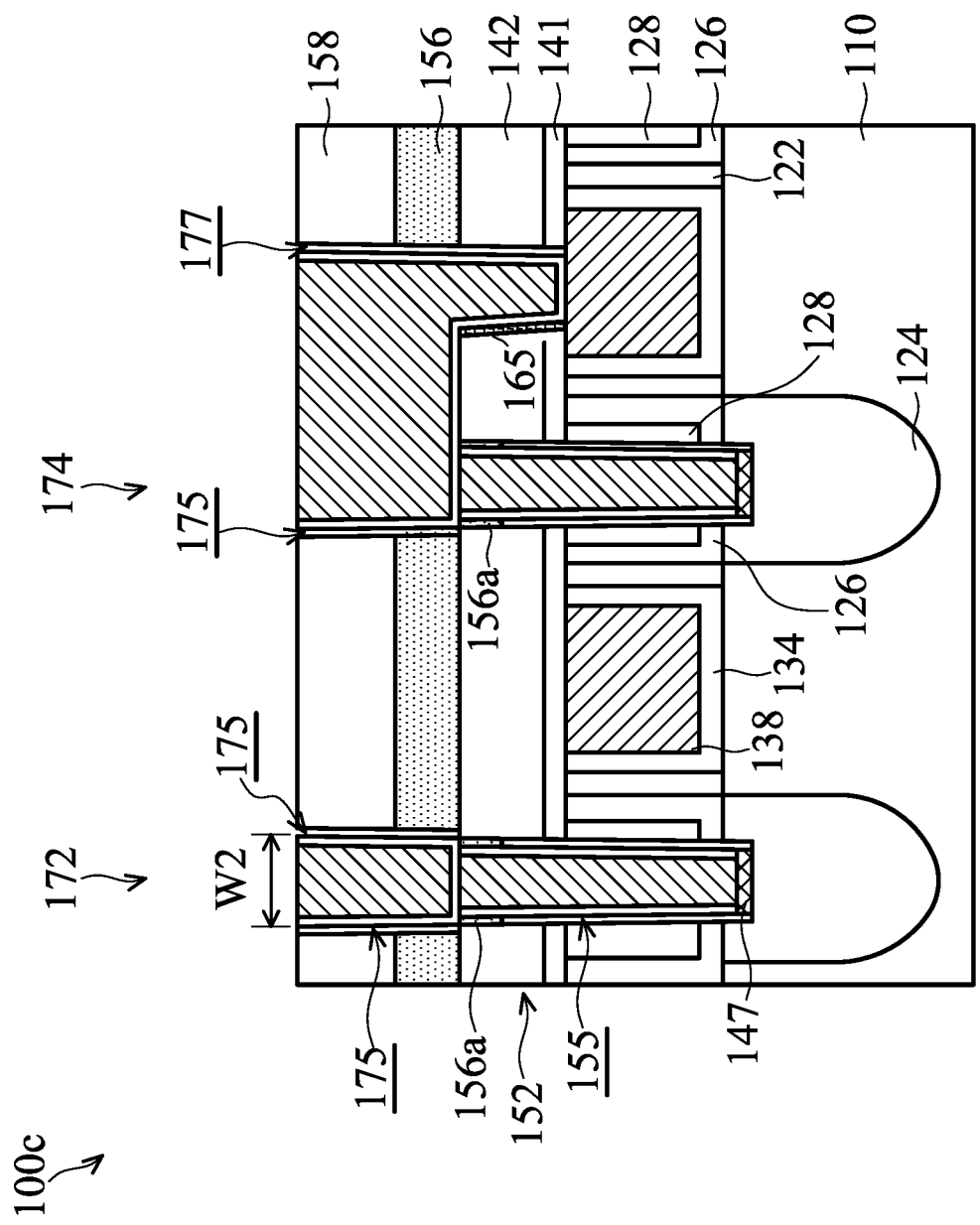

Afterwards, as shown in FIG. 4B, the second S/D contact structure 172 and the gate contact structure 174 are formed, in accordance with some embodiments of the disclosure. The bottom surface of the second air gap 175 is in direct contact with the second ILD layer 142. The second air gap 175 is not aligned with the first air gap 155.

The first S/D contact structure 152 has the first width $W_1$, and the second contact structure 172 has the second width $W_2$. In some embodiments, the second width $W_2$ of the second S/D contact structure 172 is greater than the first width $W_1$ of the first S/D contact structure 152.

Figure 4C:
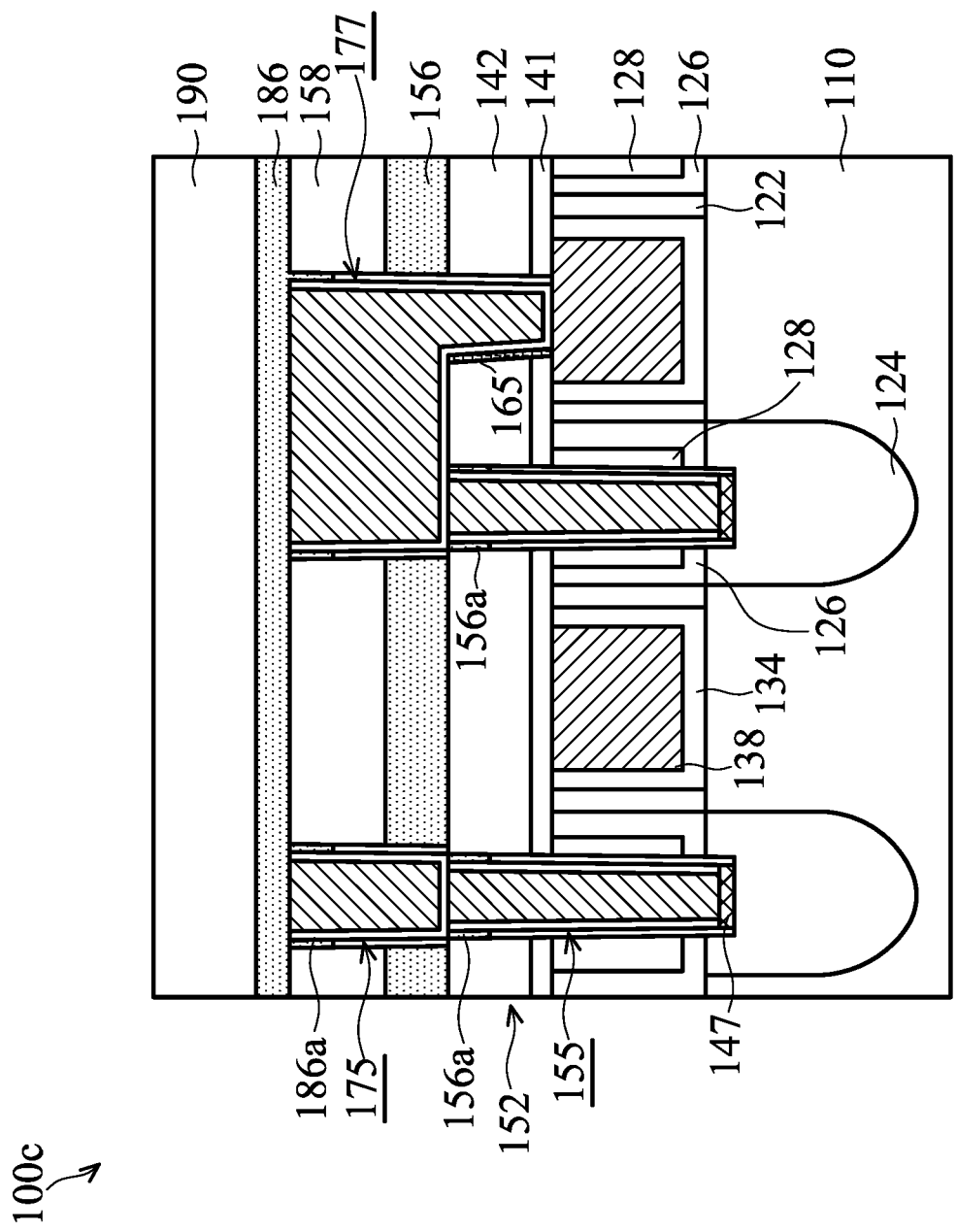

Afterwards, as shown in FIG. 4C, the second sealing layer 186 is formed over the third ILD layer 158, and the fourth ILD layer 190 is formed over the second sealing layer 186, in accordance with some embodiments of the disclosure. The second sealing layer 186 has an extending portion 186a which is formed in the second air gap 175.

Figure 4D:
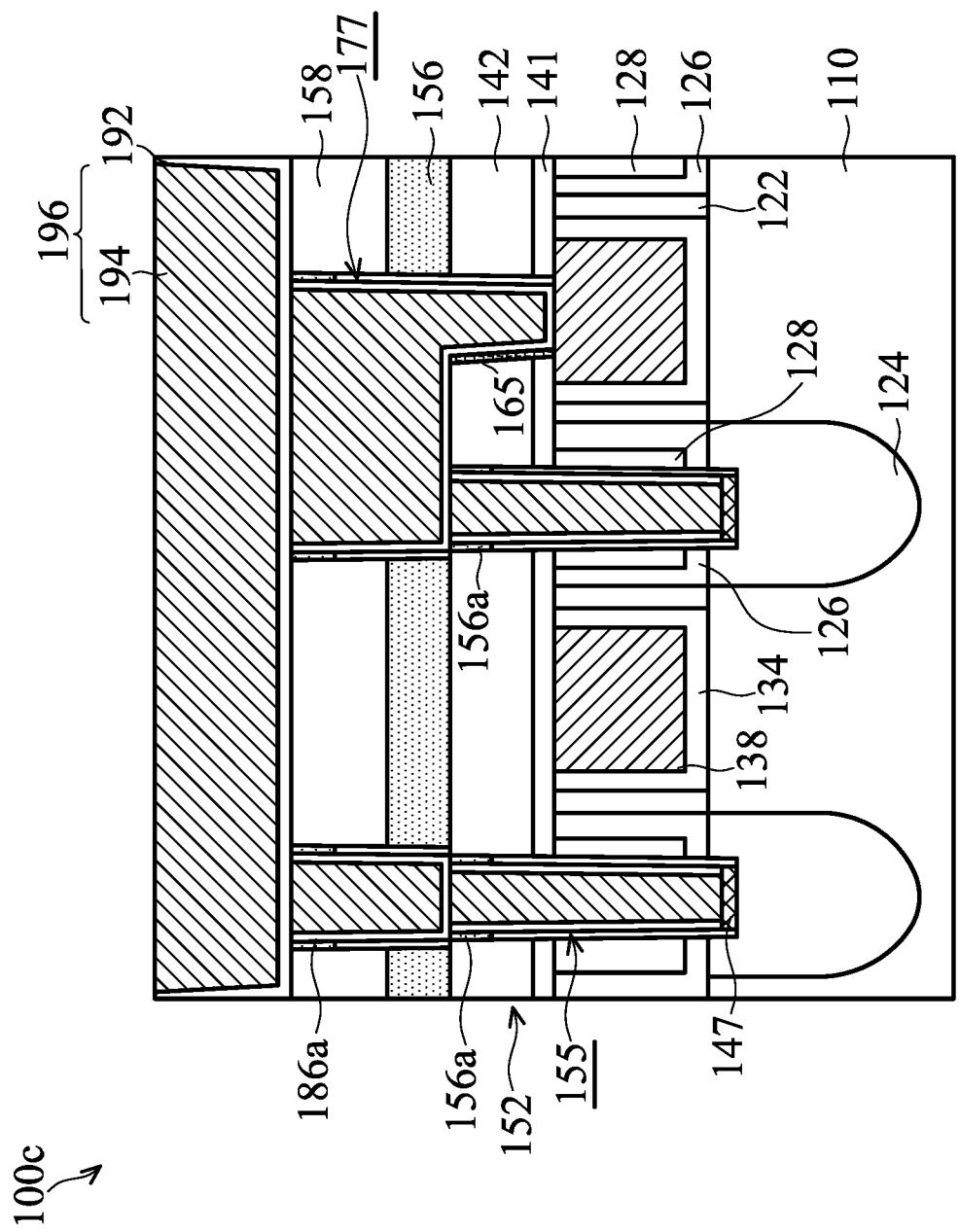

Afterwards, as shown in FIG. 4D, a portion of the second sealing layer 186 and a portion of the fourth ILD layer 190 are removed, and the conductive line 196 is formed, in accordance with some embodiments of the disclosure.

The FinFET device structure 100c in FIG. 4D is similar to the FinFET device structure 100a in FIG. 2O, the difference between FIG. 4D and FIG. 2O is that, the second S/D contact structure 172 is greater than the first S/D contact structure 152 in FIG. 4D, and the second air gap 177 is not aligned with the first air gap 155.

Figure 5:
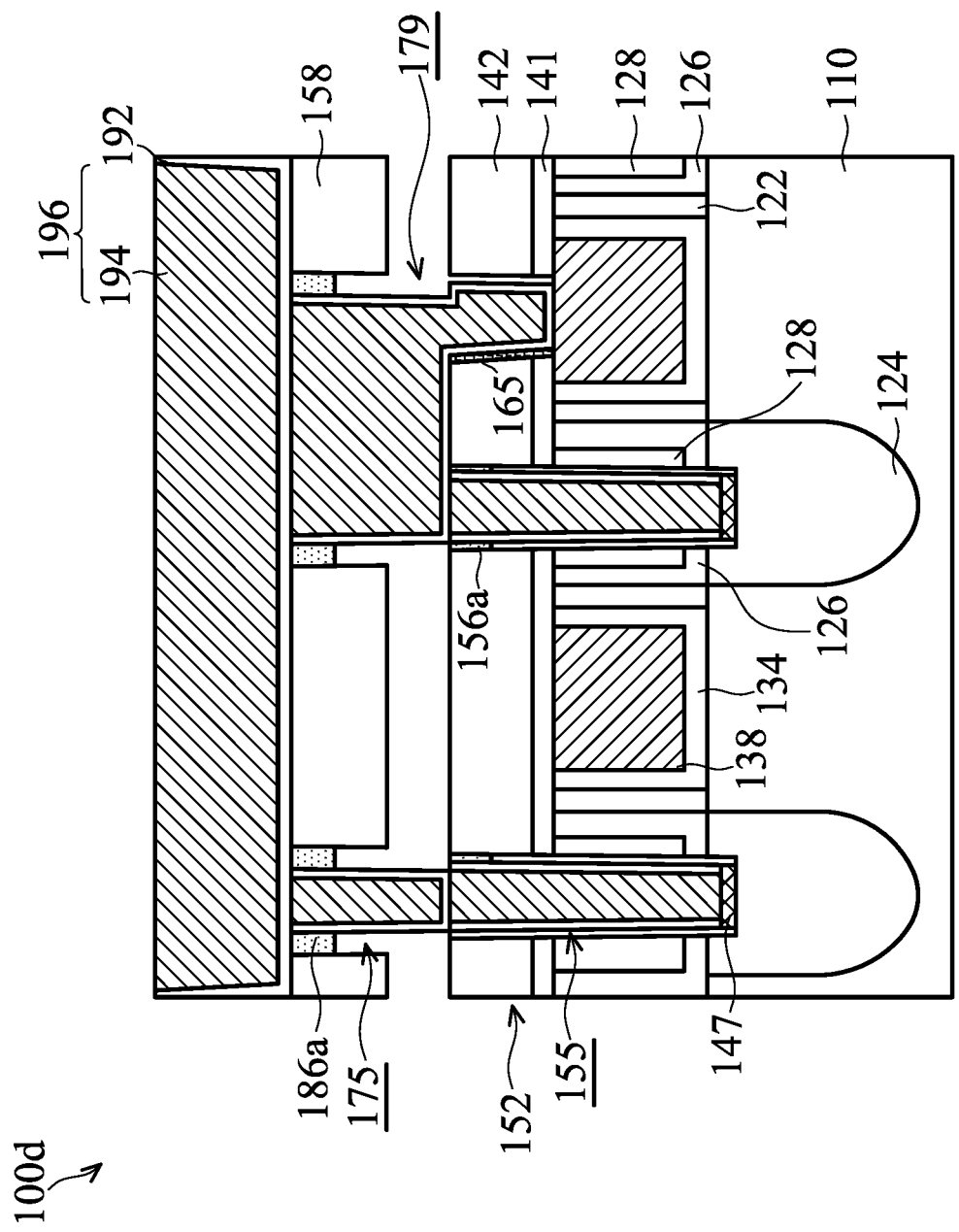
FIG. 5 shows a cross-sectional representation of a FinFET device structure, in accordance with some embodiments of the disclosure.

FIG. 5 shows a cross-sectional representation of a FinFET device structure 100d, in accordance with some embodiments of the disclosure. Some processes and materials used to form the FinFET device structure 100d in FIG. 5 are similar to, or the same as, those used to form the FinFET device structure 100a in FIGS. 2A-2O and are not repeated herein.

The FinFET device structure 100d in FIG. 5 is similar to the FinFET device structure 100a in FIG. 2O, the difference between FIG. 5 and FIG. 2O is that, the width of the second air gap 175 is greater than the width of the first air gap 155 in FIG. 5, and the width of the third air gap 177 is greater than the width of the first air gap 155. Therefore, the bottom surface of the second air gap 175 is in direct contact with the first air gap 155 and the second ILD 142.

Figure 6:
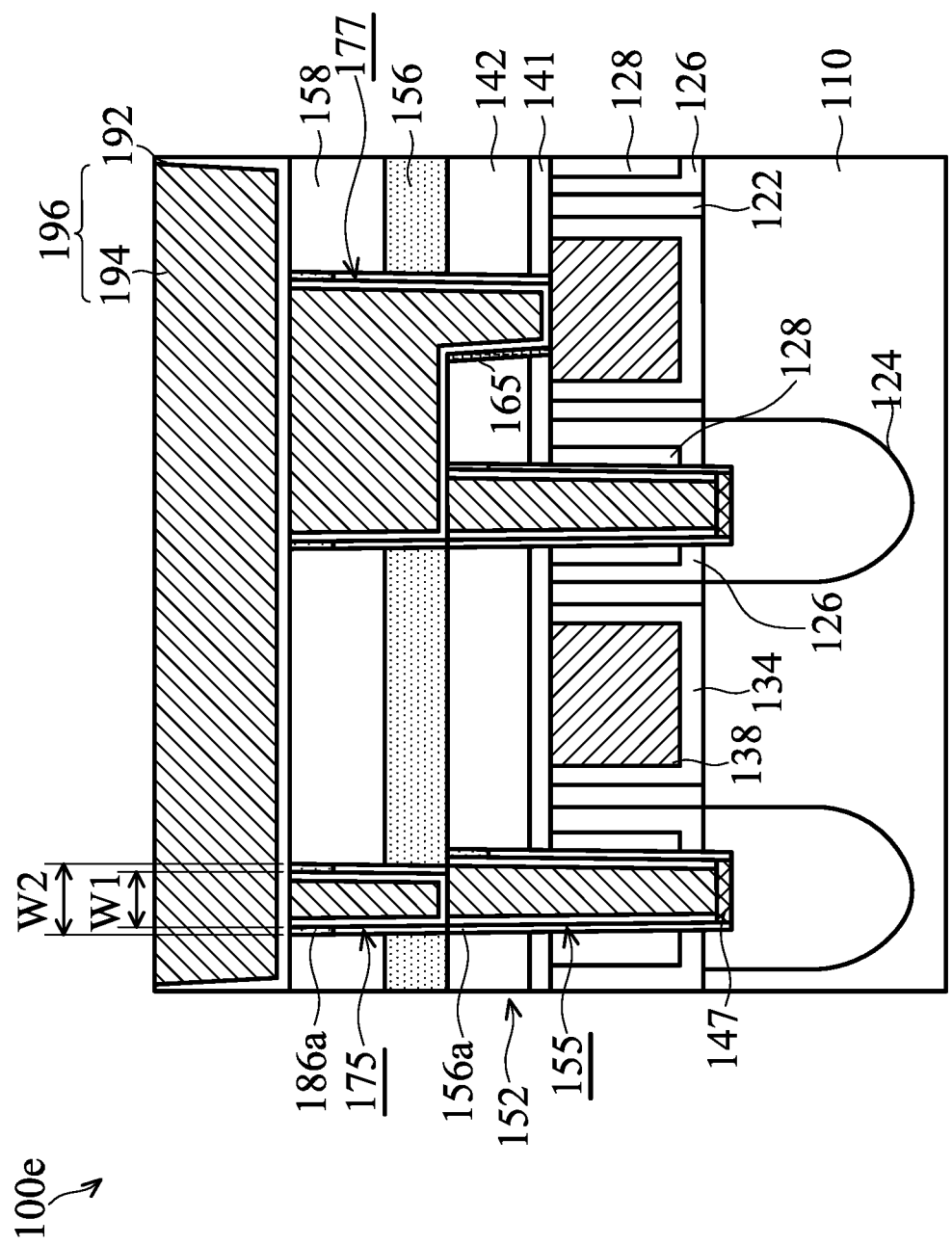
FIG. 6 shows a cross-sectional representation of a FinFET device structure, in accordance with some embodiments of the disclosure.

FIG. 6 shows a cross-sectional representation of a FinFET device structure 100e, in accordance with some embodiments of the disclosure. Some processes and materials used to form the FinFET device structure 100e in FIG. 6 are similar to, or the same as, those used to form the FinFET device structure 100a in FIGS. 2A-2O and are not repeated herein.

The FinFET device structure 100e in FIG. 6 is similar to the FinFET device structure 100a in FIG. 2O, the difference between FIG. 6 and FIG. 2O is that, the second S/D contact structure 172 has a first sidewall and a second sidewall, one second air gap 175 on the first sidewall, another second air gap 175 is formed on the second sidewall. One of the second air gaps 175 is aligned with the first air gap 155, but another one of the second air gaps 175 is not aligned with the first air gap 155. In addition, the second width $W_2$ of the second S/D contact structure 172 is smaller than the first width $W_1$ of the first S/D contact structure 152.

Figure 7:
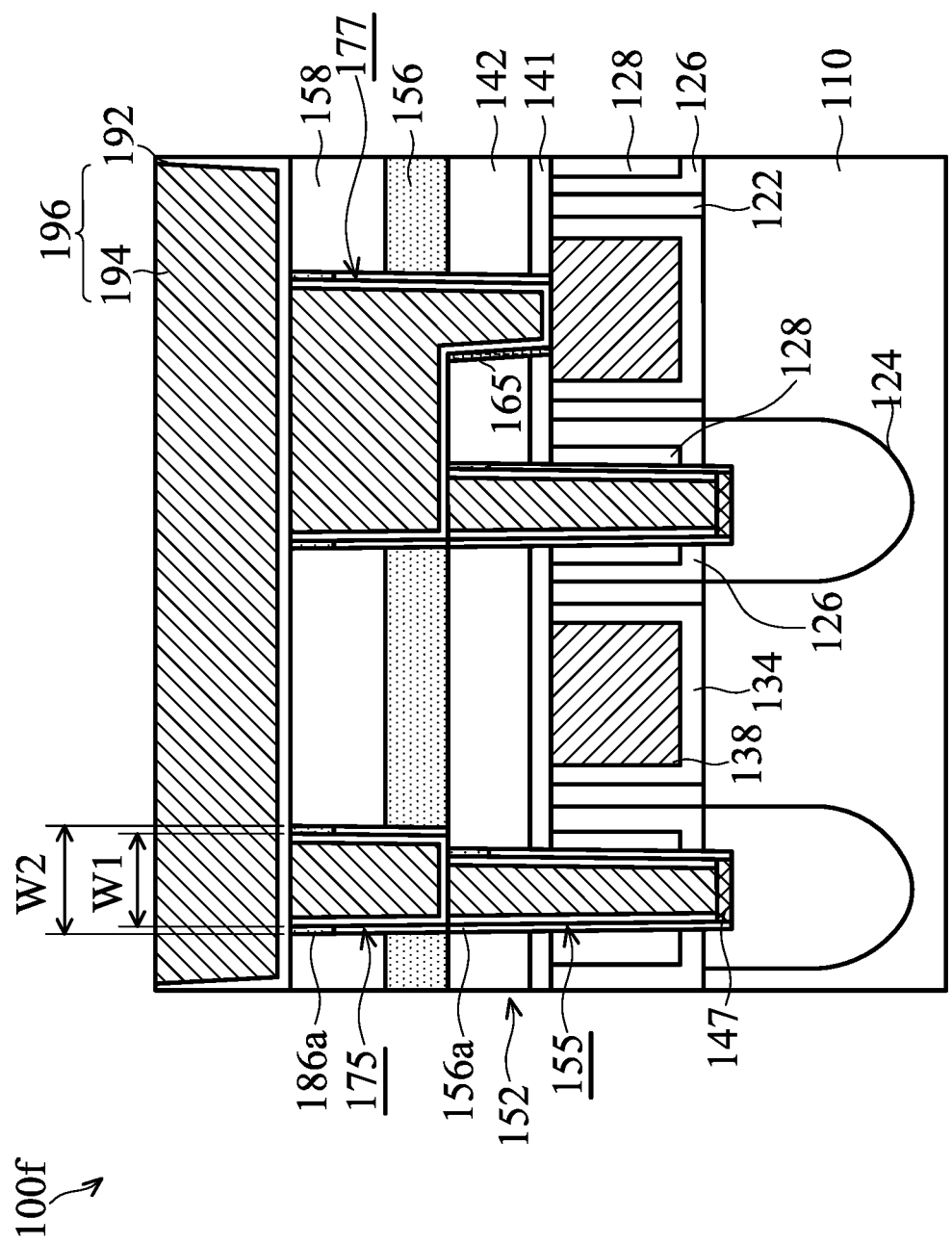
FIG. 7 shows a cross-sectional representation of a FinFET device structure, in accordance with some embodiments of the disclosure.

FIG. 7 shows a cross-sectional representation of a FinFET device structure 100f, in accordance with some embodiments of the disclosure. Some processes and materials used to form the FinFET device structure 100f in FIG. 7 are similar to, or the same as, those used to form the FinFET device structure 100a in FIGS. 2A-2O and are not repeated herein.

The FinFET device structure 100f in FIG. 7 is similar to the FinFET device structure 100e in FIG. 6, the difference between FIG. 7 and FIG. 6 is that, the second width $W_2$ of the second S/D contact structure 172 is greater than the first width W1 of the first S/D contact structure 152.

Embodiments for forming a FinFET device structure and method for formation the same are provided. The FinFET device structure includes a fin structure formed over a substrate, and a gate structure formed over the fin structure. A first S/D contact structure formed adjacent to the gate structure, and a first air gap formed on the sidewall of the first S/D contact structure. A second S/D contact structure formed over the first S/D contact structure, and a second air gap formed on the sidewall of the second S/D contact structure. The first air gap and the second air gap are used to reduce the capacitances. Therefore, the performance of the FinFET device structure is improved.

In some embodiments, a FinFET device structure is provided. The FinFET device structure includes a fin structure formed over a substrate, and a first inter-layer dielectric (ILD) layer formed over the fin structure. The FinFET device structure includes a gate structure formed in the first ILD layer, and a first S/D contact structure formed in the first ILD layer and adjacent to the gate structure. The FinFET device structure also includes a first air gap formed on a sidewall of the first S/D contact structure, and the first air gap is in direct contact with the first ILD layer.

In some embodiments, a FinFET device structure is provided. The FinFET device structure includes a fin structure formed over a substrate, and a first inter-layer dielectric (ILD) layer formed over the fin structure. The FinFET device structure includes a first gate structure formed in the first ILD layer, and a first S/D contact structure formed in the first ILD layer and adjacent to the first gate structure. The FinFET device structure also includes a second ILD layer formed over the first ILD layer, and a second S/D contact structure formed over the second S/D contact structure. The FinFET device structure includes a first air gap formed on a sidewall of the first S/D contact structure, and a second air gap formed on a sidewall of the second S/D contact structure. The bottom surface of the second air gap is in direct contact with the first air gap, the first S/D contact structure or the second ILD layer.

In some embodiments, a method for forming a FinFET device structure is provided. The method includes a forming a gate structure over a fin structure, and forming an S/D structure adjacent to the gate structure. The method also includes forming a first ILD layer over the S/D structure, and forming a second ILD layer over the first ILD layer. The method further includes forming a first trench in the first ILD and the second ILD layer to expose the top surface of the S/D structure, and forming a first sacrificial layer in the first trench. The method includes forming a first S/D contact structure in the first trench and over the first sacrificial layer, and removing the first sacrificial layer to form a first air gap on a sidewall of the first S/D contact structure. The method includes forming a sealing layer over the second ILD layer, and a portion of the sealing layer is formed in the first air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a fin structure formed over a substrate;
   a first inter-layer dielectric (ILD) layer formed over the fin structure;
   a gate structure formed in the first ILD layer;
   an S/D structure formed over the substrate;
   a first S/D contact structure formed in the first ILD layer and adjacent to the gate structure, wherein the first S/D contact structure is over the S/D structure; and
   a first air gap formed on a sidewall of the first S/D contact structure, wherein the first air gap is in direct contact with the first ILD layer, wherein a bottom surface of the first air gap is lower than a top surface of the S/D structure.

2. The fin field effect transistor (FinFET) device structure as claimed in claim 1, further comprising:
   a second ILD layer formed over the first ILD layer, wherein the first air gap is in direct contact with the second ILD layer.

3. The fin field effect transistor (FinFET) device structure as claimed in claim 2, further comprising:
   a sealing layer formed in the first air gap, wherein the sealing layer is between the first S/D contact structure and the second ILD layer, and a bottom surface of the sealing layer is lower than a top surface of the first S/D contact structure.

4. The fin field effect transistor (FinFET) device structure as claimed in claim 2, further comprising:
   a third ILD layer formed over the second ILD layer; and
   an air gap layer formed between the second ILD layer and the third ILD layer.

5. The fin field effect transistor (FinFET) device structure as claimed in claim 1, further comprising:
   a second S/D contact structure formed over the first S/D contact structure; and
   a second air gap formed on a sidewall of the second S/D contact structure.

6. The fin field effect transistor (FinFET) device structure as claimed in claim 5, wherein the first S/D contact structure has a first width, the second S/D contact structure has a second width, and the first width is equal to, smaller than or greater than the second width.

7. The fin field effect transistor (FinFET) device structure as claimed in claim 5, wherein the first air gap is aligned with the second air gap.

8. The fin field effect transistor (FinFET) device structure as claimed in claim 1, further comprising:
   a gate contact structure formed over the gate structure; and
   a second air gap formed on a sidewall of the gate contact structure.

9. The fin field effect transistor (FinFET) device structure as claimed in claim 8, wherein a portion of the gate contact structure is in direct contact with a top surface of the first S/D contact structure.

10. A fin field effect transistor (FinFET) device structure, comprising:
    a fin structure formed over a substrate;
    a first inter-layer dielectric (ILD) layer formed over the fin structure;
    a first gate structure formed in the first ILD layer;
    a first S/D contact structure formed in the first ILD layer and adjacent to the first gate structure;
    a second ILD layer formed over the first ILD layer;
    a second S/D contact structure formed over the first S/D contact structure;
    a first air gap formed on a sidewall of the first S/D contact structure; and
    a second air gap formed on a sidewall of the second S/D contact structure, wherein a bottom surface of the second air gap is in direct contact with the first air gap, the first S/D contact structure or the second ILD layer.

11. The fin field effect transistor (FinFET) device structure as claimed in claim 10, further comprising:
    a sealing layer formed over the second ILD layer, wherein the sealing layer has an extending portion which is formed in the first air gap, and a bottom surface of the extending portion of the sealing layer is lower than a top surface of the first S/D contact structure.

12. The fin field effect transistor (FinFET) device structure as claimed in claim 11, further comprising:
    a third ILD layer formed over the sealing layer, wherein the second air gap is in direct contact with a portion of the sealing layer and a portion of the third ILD layer.

13. The fin field effect transistor (FinFET) device structure as claimed in claim 10, further comprising:
    a gate contact structure formed over the gate structure; and
    a third air gap formed on a sidewall of the gate contact structure.

14. The fin field effect transistor (FinFET) device structure as claimed in claim 10, further comprising:
    a sealing layer formed in the second air gap, wherein a bottom surface of the sealing layer is lower than a top surface of the second S/D contact structure.

15. The fin field effect transistor (FinFET) device structure as claimed in claim 10, wherein the first S/D contact structure has a first width, the second S/D contact structure has a second width, and the first width is equal to, smaller than or greater than the second width.

16. The fin field effect transistor (FinFET) device structure as claimed in claim 10, further comprising:
    a metal silicide layer formed below the first S/D contact structure, wherein the metal silicide layer is in direct contact with the first air gap.

17. A method for a fin field effect transistor (FinFET) device structure, comprising:
    forming a gate structure over a fin structure;
    forming an S/D structure adjacent to the gate structure;
    forming a first ILD layer over the S/D structure;
    forming a second ILD layer over the first ILD layer;
    forming a first trench in the first ILD layer and the second ILD layer to expose the top surface of the S/D structure;
    forming a first sacrificial layer in the first trench, wherein a bottommost surface of the first sacrificial layer is lower than a top surface of the S/D structure;
    forming a first S/D contact structure in the first trench and over the first sacrificial layer;
    removing the first sacrificial layer to form a first air gap on a sidewall of the first S/D contact structure; and
    forming a sealing layer over the second ILD layer, wherein a portion of the sealing layer is formed in the first air gap.

18. The method for forming the fin field effect transistor (FinFET) device structure as claimed in claim 17, further comprising:
    forming a third ILD layer over the sealing layer;
    forming a second trench through the sealing layer and the third ILD layer;
    forming a second sacrificial layer in the second trench;
    forming a second S/D contact structure on the second sacrificial layer and in the second trench; and
    removing the second sacrificial layer to form a second air gap, wherein a portion of the sealing layer is between the first air gap and the second air gap.

19. The method for forming the fin field effect transistor (FinFET) device structure as claimed in claim 18, further comprising:
    removing the sealing layer to form an air gap layer between the second ILD layer and the third ILD layer.

20. The method for forming the fin field effect transistor (FinFET) device structure as claimed in claim 17, further comprising:
    forming a gate contact structure over the gate structure; and
    forming a third air gap on a sidewall of the gate contact structure.

\* \* \* \* \*